(12) United States Patent
Han

(10) Patent No.: US 10,435,812 B2
(45) Date of Patent: Oct. 8, 2019

(54) HETEROGENEOUS MATERIAL INTEGRATION THROUGH GUIDED LATERAL GROWTH

(71) Applicant: Yale University, New Haven, CT (US)

(72) Inventor: Jung Han, Woodbridge, CT (US)

(73) Assignee: Yale University, New Haven, CT (US)

( * ) Notice: Subject to any disclaimer, the term of this patent is extended or adjusted under 35 U.S.C. 154(b) by 383 days.

(21) Appl. No.: 14/379,088

(22) PCT Filed: Feb. 19, 2013

(86) PCT No.: PCT/US2013/026743
§ 371 (c)(1),
(2) Date: Aug. 15, 2014

(87) PCT Pub. No.: WO2013/158210
PCT Pub. Date: Oct. 24, 2013

(65) Prior Publication Data
US 2016/0017515 A1    Jan. 21, 2016

Related U.S. Application Data

(60) Provisional application No. 61/678,927, filed on Aug. 2, 2012, provisional application No. 61/600,413, filed on Feb. 17, 2012.

(51) Int. Cl.
*C30B 25/04*    (2006.01)
*C30B 25/18*    (2006.01)
(Continued)

(52) U.S. Cl.
CPC .......... *C30B 25/186* (2013.01); *C30B 25/16* (2013.01); *C30B 25/22* (2013.01); *C30B 29/406* (2013.01);
(Continued)

(58) Field of Classification Search
CPC .......... C30B 25/00; C30B 25/02; C30B 25/04; C30B 25/16; C30B 25/18; C30B 25/186;
(Continued)

(56) References Cited

U.S. PATENT DOCUMENTS 4,948,456 A    8/1990 Schubert
4,952,526 A    8/1990 Pribat et al.
(Continued)

FOREIGN PATENT DOCUMENTS

CN    101743618 A    6/2010
CN    102119243 A    7/2011
(Continued)

OTHER PUBLICATIONS

D. Pribat, et al. publication entitled "Conformal vapor phase epitaxy," Appl. Phys. Lett., vol. 55, p. 2544 (1989).*
(Continued)

*Primary Examiner* — Kenneth A Bratland, Jr.
(74) *Attorney, Agent, or Firm* — Wolf, Greenfield & Sacks, P.C.

(57) ABSTRACT

Methods are provided for generating a crystalline material. The methods comprise depositing a textured thin film in a growth seed area, wherein the textured thin film has a preferential crystallographic axis; providing a growth channel extending from the growth seed area, the growth channel permitting guided lateral growth; and growing a crystalline material in the growth channel along a direction that is substantially perpendicular to the preferential crystallographic axis of the textured thin film. A preferred crystalline material is gallium nitride, and preferred textured thin films are aluminum nitride and titanium nitride.

21 Claims, 9 Drawing Sheets

(51) Int. Cl.
*H01L 21/02* (2006.01)
*C30B 25/16* (2006.01)
*C30B 29/40* (2006.01)
*C30B 25/22* (2006.01)

(52) U.S. Cl.
CPC ...... *H01L 21/0254* (2013.01); *H01L 21/0262* (2013.01); *H01L 21/02422* (2013.01); *H01L 21/02439* (2013.01); *H01L 21/02458* (2013.01); *H01L 21/02623* (2013.01); *H01L 21/02639* (2013.01); *H01L 21/02647* (2013.01)

(58) Field of Classification Search
CPC ......... C30B 25/22; C30B 29/00; C30B 29/10; C30B 29/40; C30B 29/403; C30B 29/406; H01L 21/02422; H01L 21/02439; H01L 21/02458; H01L 21/0254; H01L 21/0262; H01L 21/02623; H01L 21/02639; H01L 21/02647
USPC ............ 117/84, 88–90, 93–95, 97, 101–102, 117/104–106, 902, 923, 937, 952
See application file for complete search history.

(56) References Cited

U.S. PATENT DOCUMENTS

| | | |
|---|---|---|
| 5,356,510 A | 10/1994 | Pribat et al. |
| 5,587,014 A | 12/1996 | Iyechika et al. |
| 5,888,853 A * | 3/1999 | Gardner ............. H01L 21/8221 257/E21.101 |
| 6,617,668 B1 | 9/2003 | Koide et al. |
| 7,390,750 B1 | 6/2008 | Ramkumar et al. |
| 7,727,874 B2 | 6/2010 | Hanser et al. |
| 8,252,684 B1 | 8/2012 | Lee et al. |
| 8,482,103 B2 | 7/2013 | Liu et al. |
| 8,698,173 B2 | 4/2014 | Goswami |
| 9,711,352 B2 | 7/2017 | Han et al. |
| 9,978,589 B2 | 5/2018 | Han et al. |
| 9,978,845 B2 | 5/2018 | Han et al. |
| 2002/0179911 A1 | 12/2002 | Linthicum et al. |
| 2002/0189534 A1* | 12/2002 | Tang ........................ C30B 23/02 117/105 |
| 2003/0211713 A1 | 11/2003 | Suguro et al. |
| 2004/0175844 A1 | 9/2004 | Yang et al. |
| 2004/0261692 A1* | 12/2004 | Dwilinski ................ C30B 7/00 117/84 |
| 2005/0184307 A1 | 8/2005 | Li et al. |
| 2006/0131606 A1 | 6/2006 | Cheng |
| 2006/0292719 A1 | 12/2006 | Lochtefeld et al. |
| 2007/0017439 A1 | 1/2007 | Xianyu et al. |
| 2007/0080369 A1 | 4/2007 | Sakai |
| 2008/0042543 A1 | 2/2008 | Conrad |
| 2008/0093622 A1 | 4/2008 | Li et al. |
| 2009/0001416 A1 | 1/2009 | Chua et al. |
| 2009/0032799 A1 | 2/2009 | Pan |
| 2009/0098343 A1 | 4/2009 | Arena et al. |
| 2010/0012948 A1 | 1/2010 | Usikov et al. |
| 2010/0102307 A1 | 4/2010 | Chua et al. |
| 2010/0117188 A1 | 5/2010 | Waldrab et al. |
| 2010/0171176 A1 | 7/2010 | Wells |
| 2010/0187568 A1 | 7/2010 | Arena |
| 2010/0210067 A1 | 8/2010 | Butcher et al. |
| 2011/0045658 A1 | 2/2011 | Liu et al. |
| 2011/0065264 A1 | 3/2011 | Moffatt et al. |
| 2011/0092052 A1 | 4/2011 | Ueno |
| 2011/0204329 A1 | 8/2011 | Craven et al. |
| 2011/0227198 A1 | 9/2011 | Wunderer et al. |
| 2011/0244663 A1 | 10/2011 | Su |
| 2011/0254134 A1 | 10/2011 | Detchprohm et al. |
| 2011/0292957 A1 | 12/2011 | Bhat et al. |
| 2012/0025195 A1* | 2/2012 | McComber ............. C23C 16/04 257/65 |
| 2012/0043528 A1 | 2/2012 | Lo et al. |
| 2012/0098102 A1 | 4/2012 | Imer et al. |
| 2012/0104558 A1 | 5/2012 | Ishibashi |
| 2012/0112603 A1 | 5/2012 | Masaki |
| 2012/0115293 A1 | 5/2012 | Noh et al. |
| 2012/0146190 A1 | 6/2012 | Liu et al. |
| 2013/0001682 A1 | 1/2013 | Tang et al. |
| 2013/0015492 A1 | 1/2013 | Hashimoto et al. |
| 2013/0029472 A1 | 1/2013 | Park et al. |
| 2013/0214248 A1 | 8/2013 | Goswami |
| 2013/0256697 A1 | 10/2013 | Dadgar et al. |
| 2013/0294782 A1 | 11/2013 | Liboiron-Ladouceur et al. |
| 2013/0313567 A1 | 11/2013 | Furuya et al. |
| 2016/0027636 A1 | 1/2016 | Han et al. |
| 2016/0215410 A1 | 7/2016 | Hashimoto et al. |
| 2017/0033186 A1 | 2/2017 | Han et al. |
| 2017/0047220 A1 | 2/2017 | Han et al. |

FOREIGN PATENT DOCUMENTS

| | | |
|---|---|---|
| CN | 103348044 A | 10/2013 |
| WO | 01/34877 A1 | 5/2001 |
| WO | 2009/015350 A1 | 1/2009 |
| WO | 2011/094391 A1 | 8/2011 |
| WO | 2015/160903 A1 | 10/2015 |

OTHER PUBLICATIONS

K.T.-Y. Kung, et al. publication entitled "Polycrlstalline Si thin-film transistors fabricated at ≤ 800° C.: Effects of grain size and {110} fiber texture," J. Appl. Phys., vol. 62, pp. 1503-1509 (1987).*
K.T.-Y. Kung, et al. publication entitled "Polycrystalline Si thin-film transistors fabricated at ≤ 800° C.: Effects of grain size and {110} fiber texture," J. Appl. Phys., vol. 62, pp. 1503-1509 (1987). (Year: 1987).*
A.E. Wickenden, et al. publication entitled "The effect of thermal annealing on GaN nucleation layers deposited on (0001) sapphire by metalorganic chemical vapor deposition," J. Appl. Phys., vol. 75, pp. 5367-5371 (1994). (Year: 1994).*
International Search Report dated Oct. 25, 2013 from corresponding International Application No. PCT/US2013/026743.
International Preliminary Report on Patentability for PCT/U20S13/026743 dated May 14, 2015.
Honda et al., Growth of GaN free from cracks on a (111) Si substrate by selective metalorganic vapor-phase epitaxy. Appl Phys Lett. Jan. 14, 2002;80(2):222-4.
Kawaguchi et al., Influence of polarity on carrier transport in semipolar (2021) and (2021) multiple-quantum-well light-emitting diodes. Appl Phys Lett. 2012;100:231110.1-4.
Piprek, Efficiency droop in nitride-based light-emitting diodes. Physica Status Solidi (a). Oct. 2010;207(10):2217-25.
Pribat et al., Conformal vapor phase epitaxy. Appl Phys Lett. 1989;55(24):2544-6. doi: 10.1063/1.101976.
Pribat et al., Defect-free, conformally grown (100) GaAs films. Appl Phys Lett. Jul. 1990;57(4):375-7. doi: 10.1063/1.103696.
Shubert et al., Confined Lateral Selective Epitaxial Growth of Silicon for Device Fabrication. IEEE Electron Device Letters. May 1990;11(5):181-3.
U.S. Appl. No. 16/324,979, filed Feb. 12, 2019, Han et al.
PCT/US2015/025899, Jul. 7, 2015, International Search Report and Written Opinion.
PCT/US2015/025899, Oct. 27, 2016, International Preliminary Report on Patentability.
PCT/US2015/025907, Aug. 12, 2015, International Search Report and Written Opinion.
PCT/US2015/025907, Oct. 27, 2016, International Preliminary Report on Patentability.
PCT/US2014/029219, Jul. 16, 2014, Invitation to Pay Additional Fees.
PCT/US2014/029219, Oct. 14, 2014, International Search Report and Written Opinion.
PCT/US2014/029219, Sep. 24, 2015, International Preliminary Report on Patentability.
PCT/US2017/046484, Oct. 19, 2017, Invitation to Pay Additional Fees.

(56) References Cited

OTHER PUBLICATIONS

PCT/US2017/046484, Dec. 22, 2017, International Search Report and Written Opinion.
PCT/US2017/046484, Feb. 21, 2019, International Preliminary Report on Patentability.
PCT/US2018/034308, Jul. 13, 2018, Invitation to Pay Additional Fees.
PCT/US2018/034308, Sep. 25, 2018, International Search Report and Written Opinion.
International Search Report and Written Opinion for International Application No. PCT/US2015/025899 dated Jul. 7, 2015.
International Preliminary Report on Patentability for International Application No. PCT/US2015/025899 dated Oct. 27, 2016.
Invitation to Pay Additional Fees for International Application No. PCT/US2015/025907 dated Jun. 4, 2015.
International Search Report and Written Opinion for International Application No. PCT/US2015/025907 dated Aug. 12, 2015.
International Preliminary Report on Patentability for International Application No. PCT/US2015/025907 dated Oct. 27, 2016.
Invitation to Pay Additional Fees for International Application No. PCT/US2014/029219 dated Jul. 16, 2014.
International Search Report and Written Opinion for International Application No. PCT/US2014/029219 dated Oct. 14, 2014.
International Preliminary Report on Patentability for International Application No. PCT/US2014/029219 dated Sep. 24, 2015.
Invitation to Pay Additional Fees for International Application No. PCT/US2017/046484 dated Oct. 19, 2017.
International Search Report and Written Opinion for International Application No. PCT/US2017/046484 dated Dec. 22, 2017.
International Preliminary Report on Patentability for International Application No. PCT/US2017/046484 dated Feb. 21, 2019.
Invitation to Pay Additional Fees for International Application No. PCT/US2018/034308 dated Jul. 13, 2018.
International Search Report and Written Opinion for International Application No. PCT/US2018/034308 dated Sep. 25, 2018.
[No Author Listed] OEMGroup Foundry Services Introduction. OEM Group. http://www.oemgroupinc.com/foundry.php, 5 pages. [last accessed May 9, 2019].
Abadias, Stress and preferred orientation in nitride-based PVD coatings. Surface and Coatings Technol. Feb. 25, 2008; 202(11): 2223-35.
Aida et al. Chemical mechanical polishing of gallium nitride with colloidal silica. Journal of The Electrochemical Society. Jan. 1, 2011;158(12):H1206-12.
Aida et al. Ultraprecision CMP for sapphire, GaN, and SiC for advanced optoelectronics materials. Curr. Appl. Phys. Sep. 2012;12:S41-6.
Alizadeh et al. Templated wide bandgap nanostructures. J. Appl. Phys. Jun. 2004;95(12):8199-206.
Atwater et al. Orientation filtering by growth velocity competition in zone-melting recrystallization of silicon on $SiO_2$. Appl. Phys. Lett. Dec. 15, 1983;43(12):1126-8.
Bai et al. Structural defects and luminescence features in heteroepitaxial GaN grown on on-axis and misoriented substrates. J. Appl. Phys. Jun. 1, 2005;97(11):116101-1-3.
Baker et al. Characterization of Planar Semipolar Gallium Nitride Films on Sapphire Substrates. J. Appl. Phys. Feb. 2006;45(6):L154-7.
Bernardini et al., Spontaneous polarization and piezoelectric constants of III-V nitrides. Physical Review B. Oct. 15, 1997;56(16):R10024.
Bhuiyan et al. Indium nitride (lnN): A review on growth, characterization, and properties. J. Appl. Phys. Sep. 1, 2003;94(5):2779-808.
Brooksby et al. Correlation of spectral luminescence with threading dislocations in green-light-emitting lnGaN quantum wells. Appl. Phys. Lett. Jun. 4, 2007;90(23):231901.
Chakraborty et al., Demonstration of nonpolar m-plane InGaN/GaN light-emitting diodes on free-standing m-plane GaN substrates. Japanese Journal of Applied Physics. Jan. 14, 2005;44(1L):L173.

Chen et al. Finite-element analysis on wafer-level CMP contact stress: reinvestigated issues and the effects of selected process parameters. Int. J. Adv. Manuf. Technol. Jun. 1, 2009;42(11-12):1118-30.
Chen et al. Growth and Optical Properties of Highly Uniform and Periodic lnGaN Nanostructures. Adv. Mater. Jul. 2, 2007; 19(13): 1707-10.
Chen et al. Single-crystal GaAs and GaSb on insulator on bulk Si substrates based on rapid melt growth. IEEE Electron Dev. Lett. Jun. 2010;31(6):597-9.
Chichibu et al. Origin of defect-insensitive emission probability in In-containing (Al,ln,Ga)N alloy semiconductors. Nature Materials. Oct. 2006;5(10):810.
Choi et al., Nearly single-crystalline GaN light-emitting diodes on amorphous glass substrates. Nature Photonics. Dec. 2011;5(12):763.
Chung et al. Seamless on-wafer integration of Si(100) MOSFETs and gaN HEMPTs. IEEE Electron. Dev. Lett. Oct. 2009;30(10):1015-7.
De Mierry et al., Semipolar GaN films on patterned r-plane sapphire obtained by wet chemical etching, Applied Physics Letters. Jun. 7, 2010;96(23):231918.
Eaglesham et al. Growth morphology and the equilibrium shape: The role of "surfactants" in Ge/Si island formation. PRL. Feb. 15, 1993;70(7):966-9.
Enya et al. 531 nm green lasing of InGaN based laser diodes on semi-polar {2021} free-standing GaN substrates. Appl. Phys. Express. Jul. 17, 2009;2(8):082101.
Evans et al., Crystal growth and orientation in deposits condensed from the vapour. Acta Cryst. Nov. 10, 1952;5(6):731-8.
Farrell et al. Materials and growth issues for high-performance nonpolar and semipolar light-emitting devices. Semicond Sci Technol. Jan. 19, 2012;27(2):024001.
Feenstra et al. Recent developments in surface studies of GaN and AlN. Journal of Vacuum Science & Technology B: Microelectronics and Nanometer Structures Processing, Measurement, and Phenomena. May 8, 2005;23(3):1174-80.
Feezell et al. Semipolar (2021) InGaN/GaN Light-Emitting Diodes for High-Efficiency Solid-State Lighing J. Disp. Technol. Apr. 2013;9(4):190-8.
Fitzgerald et al. Relaxed $Ge_xSi_{1-x}$ structures for III-V integration with Si and high mobility two-dimensional electron gases in Si. Journal of Vacuum Science & Technology B: Microelectronics and Nanometer Structures Processing, Measurement, and Phenomena. Jul. 1992;10(4):1807-19.
Fuhrmann et al. Optimization scheme for the quantum efficiency of GalnN-based green-light-emitting diodes. Appl. Phys. Lett. Feb. 13, 2006;88(7):071105.
Fujito et al., Development of bulk GaN crystals and nonpolar/semipolar substrates by HVPE. MRS bulletin. May 2009;34(5):313-7.
Funato et al. Blue, green, and amber InGaN/GaN light-emitting diodes on semipolar {1122} GaN bulk substrates. J. Appl. Phys. Jun. 30, 2006;45:L659.
Geis et al. Crystallographic orientation of silicon on an amorphous substrate using an artificial surface-relief grating and laser crystallization. Applied Physics Letters. Jul. 1, 1979;35(1):71-4.
Giermann et al. Solid-state dewetting for ordered arrays of crystallographically oriented metal particles. Applied physics letters. Mar. 21, 2005;86(12):121903-1-3.
Givargizov, Mechanisms of oriented crystallization in artificial epitaxy (graphoepitaxy). Thin Solid Films. Aug. 15, 1990;189(2):389-96.
Gomer, Diffusion of adsorbates on metal surfaces. Rep. Prog. Phys. Jul. 1990;53(7):917.
Greene et al. Development of preferred orientation in polycrystalline TiN layers grown by ultrahigh vacuum reactive magnetron sputtering. Appl. Phys. Lett. Nov. 13, 1995;67(20):2928-30.
Gühne et al., Cathodoluminescence spectroscopy of epitaxial-lateral-overgrown nonpolar (11-20) and semipolar (11-22) GaN in relation to microstructural characterization. J. of Appl Phys. Jun. 1, 2007;101(11):113101.
Hashimoto et al. Fabrication of local Ge-on-insulator structures by lateral liquid-phase epitaxy: effect of controlling interface energy

(56) References Cited

OTHER PUBLICATIONS between ge and insulators on lateral epitaxial growth. Appl. Phys. Express. May 29, 2009;2(6):066502.
Hashimoto et al., Growth of semipolar {2021} GaN and {2021} GaN for GaN substrate. physica status solidi (b). Jan. 2016;253(1):36-45.
Haskell et al. Defect reduction in (1100) m-plane gallium nitride via lateral epitaxial overgrowth by hydride vapor phase epitaxy. Appl. Phys. Lett. Mar. 14, 2005;86(11):111917.
Haskell et al. Defect reduction in (1120) a-plane gallium nitride via lateral epitaxial overgrowth by hydride vapor-phase epitaxy. Appl. Phys. Lett. Jul. 29, 2003;83(4):644-6.
Honda et al. Growth of (1101) GaN on a 7-degree off-oriented (001)Si substrate by selective MOVPE. J of Crystal Growth. Jul. 2002;242(1-2):82-6.
Ishikawa et al. Thermal stability of GaN on (111) Si substrate. J Cryst Growth. Jun. 15, 1998;189:178-82.
Ito et al. Influence of Thermal Annealing on GaN Buffer Layers and the Property of Subsequent GaN Layers Grown by Metalorganic Chemical Vapor Deposition. Jpn. J. Appl. Phys. Feb. 1999;38(Part 1, No. 2A):649-53.
Jindal et al. Selective area heteroepitaxy of low dimensional a-plane and c-plane InGaN nanostructures using pulsed MOCVD. Phys. Stat. Sol C. May 2008;5(6):1709-11.
Kajikawa et al. Comprehensive perspective on the mechanism of preferred orientation in reactive-sputter-deposited nitrides. J. Vac. Sci. Technol. A. 2003;21(6):1943-54.
Kamimura et al. Dislocation reduction via selective-area growth of InN accompanied by lateral growth by rf-plasma-assisted molecular-beam epitaxy. Appl. Phys. Lett. Oct. 4, 2010;97(14):141913.
Kaneta et al. Nanoscopic recombination processes in InGaN/GaN quantum wells emitting violet, blue and green spectra. Phys. Rev. B. Sep. 16, 2008;78(12):125317.
Kawaguchi et al. The formation of crystalline defects and crystal growth mechanism in $In_xGa_{1-x}N$/GaN heterostructure grown by metalorganic vapor phase epitaxy. J. Cryst. Growth. Jun. 15, 1998;189/190:24-8.
Keller et al. Influence of sapphire nitridation on poperties of gallium nitride grown by metalorganic chemical vapor deposition. Appl. Phys. Lett. Mar. 11, 1996;68(11):1525-7.
Kim et al. Compositional analysis of In-rich InGaN layers grown on GaN templates by metalorganic chemical vapor deposition. J. Cryst. Growth. Jun. 1, 2008;310(12):3004-8.
Kim et al. Formation of V-shaped pits in InGaN/GaN multiquantum wells and bulk InGaN films. Appl. Phys. Lett. Sep. 21, 1998;73(12):1634-6.
Kim et al., Improved electroluminescence on nonpolar m-plane InGaN/GaN quantum wells LEDs. Physica status solidi (RRL)—Rapid Research Letters. May 2007;1(3):125-7.
Kioupakis et al. Indirect Auger recombination as a cause of efficiency droop in nitride light-emitting diodes. Appl. Phys. Lett. Apr. 18, 2011;98(16):161107.
Krames et al. Status and future of high-power light-emitting diodes for solid-state lighting. J. Display Technol. Jun. 2007;3(2):160-75.
Kumagai et al. Polarity dependence of AlN {0001} decomposition in flowing $H_2$. J. Cryst. Growth. Jul. 15, 2007;305(2):366-71.
Kuykendall et al. Complete composition tunability of InGaN nanowires using a combinatorial approach. Nature Materials. Dec. 2007;6(12):951.
Langdo et al. High quality Ge on Si by epitaxial necking. Appl. Phys. Lett. Jun. 19, 2000;76(25):3700-2.
Lazarev et al. Three-dimensional reciprocal space mapping of diffuse scattering for the study of stacking faults in semipolar (1122) GaN layers grown from the sidewall of an r-patterned sapphire substrate. J. Appl. Crystallogr. Oct. 2013;46(5):1425-33.
Leonhardt et al. Energetics of Ge nucleation on $SiO_2$ and implications for selective area growth. Surf. Sci. Aug. 15, 2009;603(16):2624-9.
Leung et al. Complete orientational access for semipolar GaN devices on sapphire. Phys. Status Solidi B. Jan. 2016;253(1):23-35.
Leung et al. Growth evolution and microstructural characterization of semipolar (1122) GaN selectively grown on etched r-plane sapphire. J. Cryst. Growth. Feb. 2012;341(1):27-33.
Leung et al. Optical emission characteristics of semipolar (1122) GaN light-emitting diodes grown on m-sapphire and stripe-etched r-sapphire. Semicond. Sci. Technol. Jan. 19, 2012;27(2):024016.
Leung et al. Using the kinetic Wulff plot to design and control nonpolar and semipolar GaN heteroepitaxy. Semiconductor Science and Technology. Jan. 19, 2012;27(2):024005.
Leung et al., Semipolar (2021) GaN and InGaN quantum wells on sapphire substrates. Appl. Phys. Lett. Jun. 30, 2014;104(26):262105.
Li et al. Strain influenced indium composition distribution in GaN/InGaN core-shell nanowires. Appl. Phys. Lett. Nov. 1, 2010;97(18):181107.
Liu et al, High-quality single-crystal Ge on insulator by liquid-phase epitaxy on Si substrates. Appl. Phys. Lett. Apr. 2004;84(14):2563-5.
Liu et al. Selective area epitaxy of ultra-high density InGaN quantum dots by diblock copolymer lithography. Nanoscale Res. Lett. Dec. 2011;6(1):342.
Marchand et al. Mechanisms of lateral epitaxial overgrowth of gallium nitride by metalorganic chemical vapor deposition. J. Cryst Growth. Dec. 15, 1998;195(1-4):328-32.
Masui et al., Nonpolar and Semipolar III-Nitride Light-Emitting Diodes: Achievements and Challenges. IEEE Trans Electron Devices. Jan. 2010;57(1):88-100.
Matsuoka et al. N-polarity GaN on sapphire substrate grown by MOVPE. Phys. Status Solidi B. Jun. 2006;243(7):1446-50.
McComber et al. Single-Crystal Germanium Growth on Amorphous Silicon. Advanced Functional Materials. Mar. 7, 2012;22(5):1049-57.
Meisch et al. (20-21) MOVPE and HVPE GaN grown on 2" patterned sapphire substrates. Phys Status Solidi C. Apr. 2014;11(3-4):537-40.
Melloch et al., Formation of arsenic precipitates in GaAs buffer layers grown by molecular beam epitaxy at low substrate temperatures. Appl. Phys. Lett. Oct. 8, 1990;57(15):1531-3.
Mileham et al. Wet chemical etching of AlN. Appl. Phys. Lett. Sep. 1995;67(8):1119-21.
Mo et al. Growth and characterization of InGaN blue LED structure on Si(111) by MOCVD. J. Cryst Growth. Dec. 1, 2005;285(3):312-7.
Monemar et al. Growth of thick GaN layers with hydride vapour phase epitaxy. J. Cryst. Growth. Jul. 15, 2005;281(1):17-31.
Moutanabbir et al. Heterogeneous integration of compound semiconductors. Annu. Rev. Mater. Res. Aug. 4, 2010;40:469-500.
Ni et al. Epitaxial lateral overgrowth of (1122) semipolar GaN on (1100) m-plane sapphire by metalorganic chemical vapor deposition. Appl. Phys. Lett. Apr. 30, 2007;90(18):182109.
Ohuchi et al., AlN thin films with controlled crystallographic orientations and their microstructure. J Vac Sci Technol A: Vacuum, Surfaces, and Films. Jul. 1987;5(4):1630-4.
Okada et al. Characterization and growth mechanism of nonpolar and semipolar GaN layers grown on patterned sapphire substrates. Semicond. Sci. Technol. Jan. 19, 2012;27(2):024003.
Okada et al. Direct Growth of m-plane GaN with Epitaxial Lateral Overgrowth from c-plane Sidewall of a-plane Sapphire. Appl. Phys. Express. Oct. 31, 2008;1(11):111101.
Okada et al. Growth Mechanism of Nonpolar and Semipolar GaN Layers from Sapphire Sidewalls on Various Maskless Patterned Sapphire Substrates. Jpn. J. Appl. Phys. Mar. 22, 2011;50(3R):035602.
Okada et al. Growth of Semipolar (1122) GaN Layer by Controlling Anisotrophic Gowth Rates in r-Plane Pattened Sapphire Substrate. Appl. Phys. Express. Aug. 28, 2009;2(9):091001.
Okada et al. High-quality {2021} GaN layers on patterned sapphire substrate with wide-terrace. Appl. Phys. Lett. Dec. 12, 2011;99(24):242103.
Pan et al. High-power, low-efficiency-droop semipolar (2021) single-quantum-well blue light-emitting diodes. Appl. Phys. Express. Jun. 4, 2012;5(6):062103.
Paskov et al. Emission properties of a-plane GaN grown by metal-organic chemical-vapor deposition. J. Appl. Phys. Nov. 1, 2005;98(9):093519.

(56) References Cited

OTHER PUBLICATIONS

Paskova et al. GaN Substrates—Progress, Statue, and Prospects. IEEE J. Sel. Top. Quantum Electron. Jul.-Aug. 2009;15(4):1041-52.
Pearton et al., Fabrication and performance of GaN electronic devices. Mater Sci Eng: R: Rep. Dec. 1, 2000;30(3-6):55-212.
Pereira et al. Compositional pulling effects in $In_xGa_{1-x}N$/GaN layers: a combined depth-resolved cathodoluminescence and Rutherford backscattering/channeling study. Phys. Rev. B. Nov. 2, 2011;64(20):205311.
Pereira et al. Strain and composition distributions in wurtzite InGaN/GaN layers extracted from x-ray reciprocal space mapping. Appl. Phys. Lett. May 27, 2002;80(21):3913-5.
Ploch et al. Topography of AlGaN, GaN and InGaN layers grown by metal-organic vapor phase epitaxy. J. Cryst. Growth. Oct. 2012;356(1):70-4.
Preble et al. 2"-4" diameter GaN-on-sapphire substrates free of wafer bow at all temperatures. Phys. Status Solidi C. Apr. 2014;11(3-4):604-7.
Rao et al. Compositional dependence of phase separation in InGaN layers. Appl. Phys. Lett. Sep. 13, 2004;85(11):1961-3.
Romano et al. Structural and optical properties of pseudomorphic $In_xGa_{1-x}N$ alloys. Appl. Phys Lett. Sep. 28, 1998;73(13):1757.
Romanov et al., Basal plane misfit dislocations and stress relaxation in III-nitride semipolar heteroepitaxy. Journal of Applied Physics. May 15, 2011;109(10):103522.
Romanov et al., Strain-induced polarization in wurtzite III-nitride semipolar layers. Journal of Applied Physics. Jul. 15, 2006;100(2):023522.
Sato et al. Optical properties of yellow light-emitting diodes grown on semipolar (1122) bulk GaN substrates. APL. Jun. 2, 2008;92(22):221110.
Sato et al., High power and high efficiency semipolar InGaN light emitting diodes. Journal of Light & Visual Environment. 2008;32(2):107-10.
Schubert et al., Solid-state light sources getting smart. Science. May 27, 2005; 308(5726):1274-8.
Schwaiger et al. Planar semipolar (1011) GaN on (1123) sapphire. Appl. Phys. Lett. Jul. 7, 2010;96(23):231905.
Sekiguchi et al. Emission color control from blue to red with nanocolumn diameter of InGaN/GaN nanocolumn arrays grown on same substrate. Appl. Phys. Lett. Jun. 7, 2010;96(23):231104.
Shioda et al. Kinetic Analysis of InN Selective Area Metal-Organic Vapor Phase Epitaxy. Appl. Phys. Express. Jul. 11, 2008;1(7):071102.
Shioda et al. Selectivity enhancement by hydrogen addition in selective area metal-organic vapor phase epitaxy of GaN and InGaN. Phys. Stat. Sol A. Jun. 2010;207(6):1375-8.
Shiosaki et al. Low-temperature growth of piezoelectric AlN film by rf reactive planar magnetron sputtering. Appl. Phys. Lett. Apr. 15, 1980;36(8):643-5.
Shivaraman et al. Comparitive analysis of 2021 and 2021 semipolar GaN light emitting diodes using atom probe tomography. Appl. Phys. Lett. Jun. 24, 2013;102(25):251104.
Smith et al., Silicon-on-insulator by graphoepitaxy and zone-melting recrystallization of patterned films. J. Crystal Growth. Oct. 2, 1983:63(3):527-46.
Song et al. Semipolar (2021) GaN and InGaN light emitting diodes grown on sapphire. ACS Applied Materials & Interfaces. Apr. 11, 2017;9(16):14088-92.
Song et al., Nitrogen-Polar (0001) GaN Grown on c-Plane Sapphire with High-Temperature AlN Buffer. Materials. Mar. 2017;10(3):252.
Srivastava et al., Silicon substrate removal of GaN DHFETs for enhanced (>1100 V) breakdown voltage. IEEE Electron Device Letters. Aug. 2010;31(8):851-3.
Srolovitz et al., Simulation of faceted film growth in two-dimensions: microstructure, morphology and texture. Acta Materialia. May 28, 1999;47(7):2269-81.
Sun et al. Improving microstructural quality of semipolar (1122) GaN on m-plane sapphire by a two-step growth process. Appl. Phys. Lett. Dec. 7, 2009;95(23):231904.
Sun et al. Morphological and microstructural evolution in the two-step growth of nonpolar a-plane GaN on r-plane sapphire. J. Appl. Phys. Dec. 15, 2009;106(12):123519.
Sun et al. N-face GaN growth on c-plane sapphire by metalorganic chemical vapor deposition. J. Cryst. Growth. May 1, 2009;311(10):2948-52.
Sun et al. Nitrogen-polar GaN growth evolution on c-plane sapphire. Appl. Phys. Lett. Sep. 29, 2008;93(13):131912.
Sun et al. Understanding and Controlling Heteroepitaxy with the Kinetic Wulff plot: a case study with GaN. Journal of Applied Physics, Sep. 2011;110(5):053517.
Sun et al. Understanding nonpolar GaN growth through kinetic Wulff plots. J. Appl. Phys. Nov. 1, 2008;104(9):093523.
Sundgren, Structure and properties of TiN coatings. Thin solid films. Jun. 14, 1985;128(12):21-44.
Takagi et al. High-Power (over 100mW) Green Laser Diodes on Semipolar {2021} GaN Substrates Operating at Wavelengths beyond 530 nm. Appl. Phys. Express. Jul. 12, 2012;5(8):082102.
Tako et al. Single-crystalline (100) Ge networks on insulators by rapid-melting growth along hexagonal mesh-pattern. Appl. Phys. Lett. Jan. 24, 2011;98(4):042101.
Thompson et al., Stress and grain growth in thin films. J. Mech. Phys. Solids. May 1996;44(5):657-73.
Thompson, Structure evolution during processing of polycrystalline films. Ann Rev Mater Sci. Aug. 2000;30(1):159-90.
Thornton, High rate thick film growth. Ann Rev Mater Sci. Aug. 1977;7(1):239-60.
Tsao et al., The Blue LED Nobel Prize: Historical context, current scientific understanding, human benefit. Ann Phys (Berlin). Jun. 2015;527(5-6):A53-61. DOI 10.1002/andp.201570058.
Ueno et al. Growth of semipolar {11-22} GaN using $SiN_x$ intermediate layer by hydride vapor phase epitaxy. Phys. Status Solidi C. Apr. 2014;11(3-4):557-60.
Van Der Drift, Evolutionary selection, a principle governing growth orientation in vapour-deposited layers. Philips Res Repts. 1967;22:267-88.
Van Swygenhoven, Grain boundaries and dislocations. Science. Apr. 5, 2002;296(5565):66-7.
Venables et al. Nucleation and growth of thin films. Rep. Prog. Phys. Apr. 1984;47(4):399.
Vickers et al., Determination of the composition and thickness of semi-polar and non-polar III-nitride films and quantum wells using x-ray scattering. J Appl Phys. Feb. 15, 2012;111(4):043502-1.
Wang et al. Fabrication of GaN nanowire arrays by confined epitaxy. Appl. Phys. Lett. Dec. 4, 2006;89(23):233115.
Warren et al. Arsenic precipitates and the semi-insulating properties of GaAs buffer layers grown by low-temperature molecular beam epitaxy. Appl. Phys. Lett. Sep. 24, 1990;57(13):1331-3.
Watanabe et al., The growth of single crystalline GaN on a Si substrate using AlN as an intermediate layer. J Cryst Growth. Mar. 1, 1993;128(1-4):391-6.
Wernicke et al. Indium incorporation and emission wavelenth of polar, nonpolar and semipolar InGaN quantum wells. Semicond. Sci. Technol. Jan. 19, 2012;27(2):024014.
Wild et al. Chemical vapour deposition and characterization of smooth {100}-faceted diamond films. Diamond and Related Materials. Mar. 31, 1993;2(2-4):158-68.
Wu et al. Temperature dependence of the fundamental band gap of InN. J. Appl. Phys. Oct. 1, 2003;94(7):4457-60.
Xi et al. Microstructure and strain analysis of GaN epitaxial films using in-plane grazing incidence x-ray diffraction. Chin. Phys. B. Jul. 15, 2010;19(7):76804.
Yamamoto et al. High-Efficiency Single-Quantum-Well Green and Yellow-Green Light-Emitting Diodes on Semipolar (2021) GaN Substrates. Appl. Phys. Exp. Dec. 2010;3(12):122102.
Yamane et al. Characterization of structural defects in semipolar {2021} GaN layers grown on {2243} patterned sapphire substrates. J. Appl. Phys. Feb. 14, 2014;53(3):035502.
Yamane et al. Fabrication of freestanding {20-21} GaN substrates by HVPE using $SiO_2$ masked GAN templates. Phys. Status Solidi C. Feb. 20, 2014;11(3-4):401-4.

(56) References Cited

OTHER PUBLICATIONS

Yamane et al. Reduction in Dislocation Density of Semipolar GaN Layers on Patterned Sapphire Substrates by Hydride Vapor Phase Epitaxy. Appl. Phys. Express. Sep. 3, 2012;5(9):095503.

Yerina et al. Shape transformation of nanoporous GaN by annealing: From buried cavities to nanomembranes. Applied Physics Letters. Jun. 20, 2011;98(25):251910.

Zhao et al. 30-mW-Class High-Power and High-Efficiency Blue Semipolar (1011) InGaN/GaN Light-Emitting Diodes Obtained by Backside Roughening Technique. Appl. Phys. Exp. Oct. 2010;3(10):102101.

Zhao et al. Green semipolar (2021) InGaN light-emitting diodes with small wavelength shift and narrow spectral linewidth. Appl. Phys. Express. May 24, 2013;6(6):062102.

Zhao et al. High-power blue-violet semipolar (2021) InGaN/GaN light-emitting diodes with low efficiency droop at 200 A/cm2. Appl. Phys. Express. Jul. 15, 2011;4(8):082104.

Zhao et al. Indium incorporation and emission properties of nonpolar and semipolar InGaN quantum wells. Appl. Phys. Lett. May 14, 2012;100(20):201108.

Zhao et al., Green semipolar (2021) InGaN light-emitting diodes with small wavelength shift and narrow spectral linewidth Applied Physics Express. May 24, 2013;6(6):062102.

Zhong et al. Demonstration of high power blue-green light emitting diode on semipolar (1122) bulk GaN substrate. Electronic Letters. Jul. 2007;43(15):825-6.

Zubia et al. Nanoheteroepitaxy: The Application of nanostructuring and substrate compliance to the heteroexplitaxy of mismatched semiconductor materials. J. Appl. Phys. May 1, 1999;85(9):6492-6.

\* cited by examiner

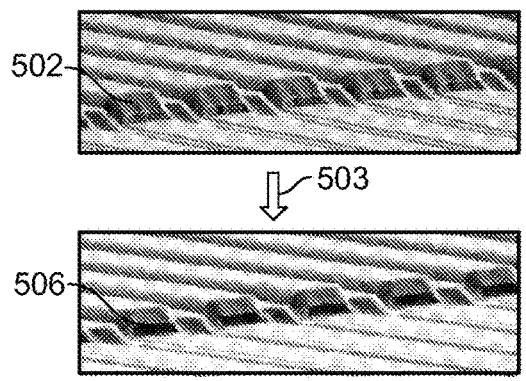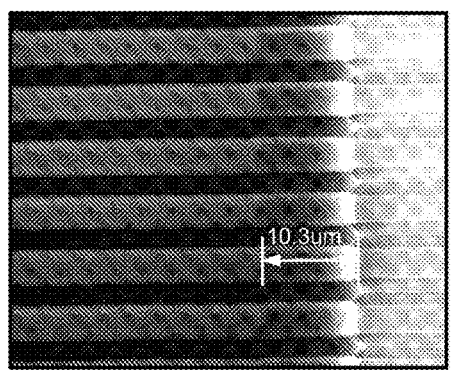
FIG. 5A
FIG. 5B
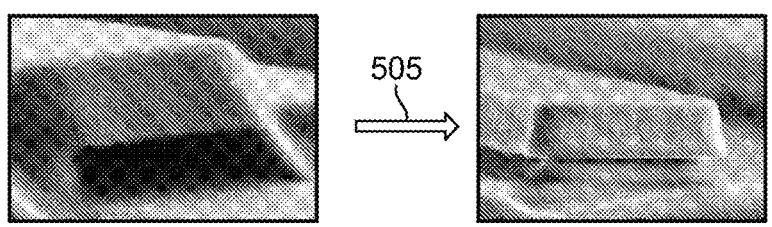
FIG. 5C
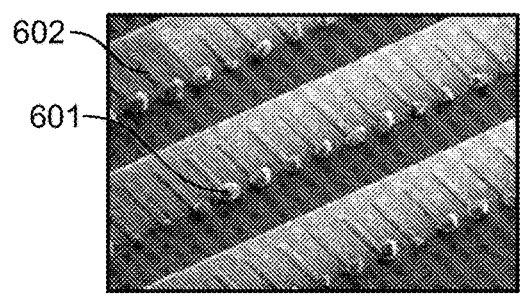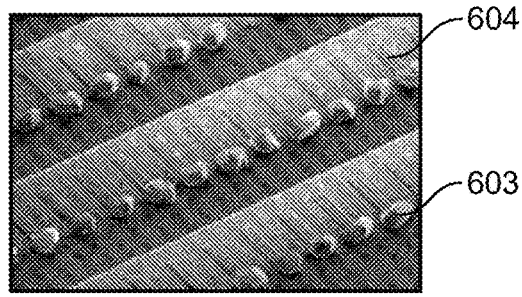
FIG. 6A
FIG. 6B
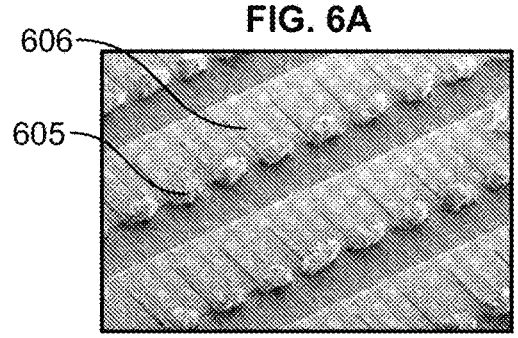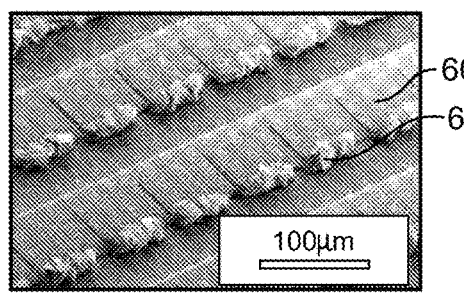
FIG. 6C
FIG. 6D

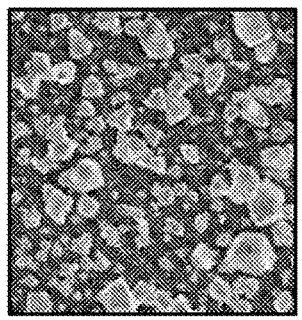
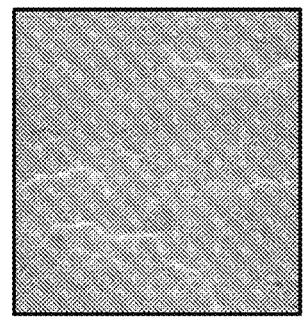
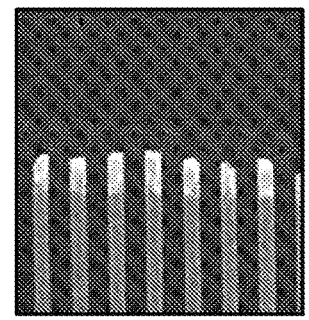
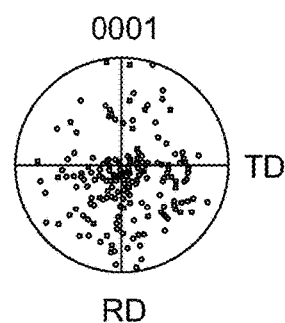
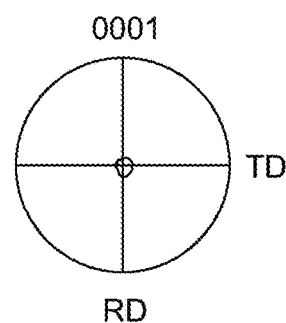
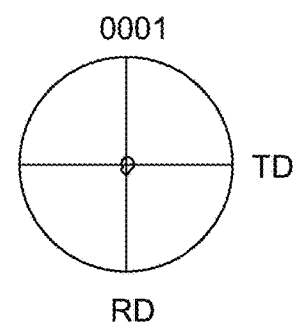
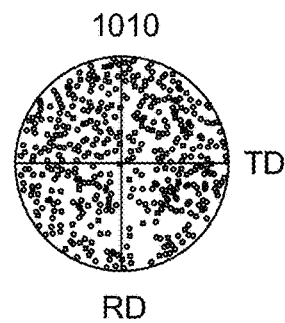
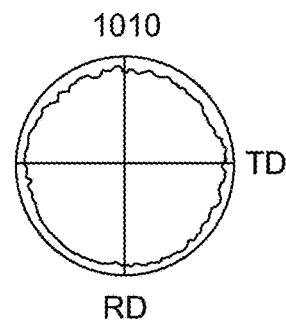
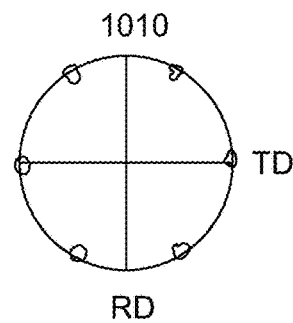
FIG. 7A      FIG. 7B      FIG. 7C

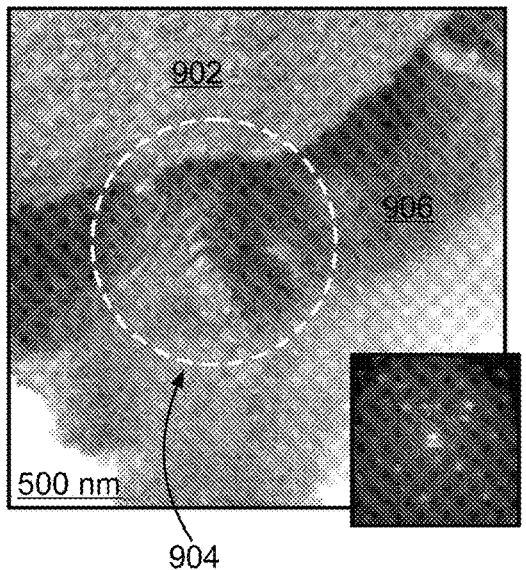
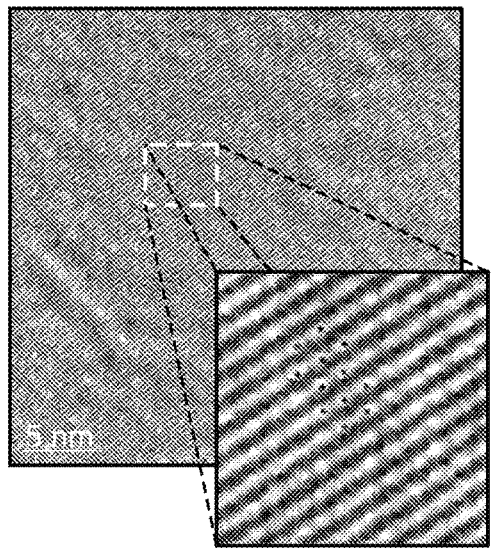
FIG. 9A       FIG. 9B
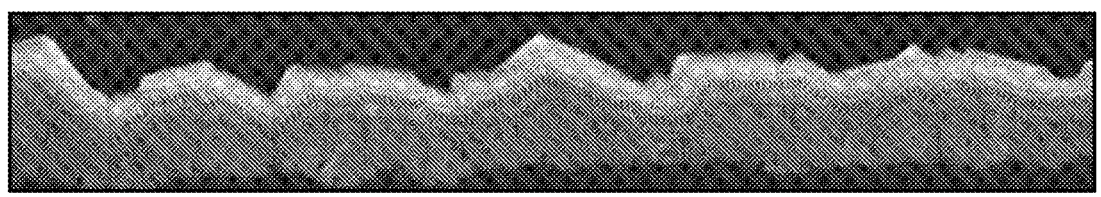
FIG. 10A
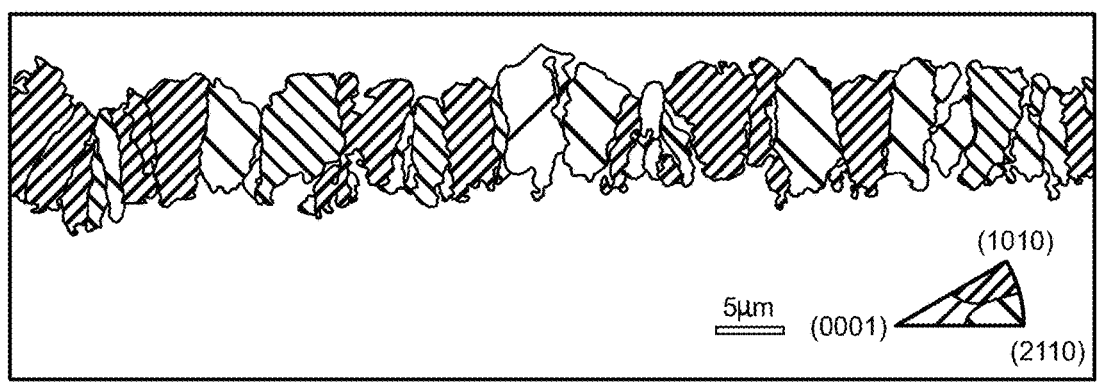
FIG. 10B

HETEROGENEOUS MATERIAL INTEGRATION THROUGH GUIDED LATERAL GROWTH

PRIORITY CLAIM

This application is the national phase of International Application No. PCT/US2013/026743, filed on Feb. 19, 2013, which is a non-provisional of, claims priority to and the benefit of U.S. Provisional Patent Application No. 61/600,413 filed Feb. 17, 2012, and the U.S. Provisional Patent Application No. 61/678,927, filed Aug. 2, 2012, the entire contents of which are incorporated herein by reference to the maximum extent allowable by law.

PRIORITY CLAIM

This application is a non-provisional of, claims priority to and the benefit of U.S. Provisional Patent Application No. 61/600,413 filed Feb. 17, 2012, and the U.S. Provisional Patent Application No. 61/678,927, filed Aug. 2, 2012, the entire contents of which are incorporated herein.

STATEMENT REGARDING FEDERALLY SPONSORED RESEARCH OR DEVELOPMENT

This invention was made with government support under DE-SC0001134 awarded by Department of Energy. The government has certain rights in the invention.

BACKGROUND

A crystal is a solid material made up of atoms, molecules, or ions arranged in an orderly repeating pattern extending in all three spatial dimensions. Crystal growth occurs by the addition of new atoms, molecules, or ions, into the characteristic arrangement of a crystalline lattice. The type(s) of atoms, molecules, or ions that make up the crystal can form one or more typical crystical lattices. Crystal growth typically follows an initial stage of either homogeneous or heterogeneous (surface catalyzed) nucleation, unless a "seed," on which crystal growth can begin, is already present.

Monocrystalline silicon or single-crystal silicon is the most common material of the electronic industry. It is made up of silicon in which the crystal lattice of the entire solid is continuous and unbroken (with no grain boundaries) to its edges. It can be made of pure silicon or doped with small quantities of other elements to change its semiconducting properties. Layered silicon-insulator-silicon substrates have also been used in place of silicon substrates in semiconductor manufacturing, especially microelectronics, to improve performance.

With the increased demand in the performance and complexity of microelectronic and optoelectronic devices, there is an increasing need to integrate dissimilar devices and materials onto the same chip for increased performance and reduced cost. At present, the silicon microelectronics industry has reached a state of maturity, in that 12" to 16" wafers are readily available, and foundry services are much more affordable. Other electronic and photonic materials (GaAs, InP, GaN, Ge, InSb, and others) can benefit tremendously from tapping into existing momentum and infrastructures that have been developed over the past five decades.

Epitaxy of semiconductor layers has enabled contemporary optoelectronic and microelectronic industry. A fundamental prerequisite in epitaxy is the availability of crystalline substrates having a reasonable match in crystallographic structure and atomic registry. The ability to prepare single crystalline layers on amorphous or polycrystalline substrates is a tantalizing yet conceptually daunting quest: on a surface with no long-range atomic ordering, it is challenging to proceed with nucleation, incorporation, and growth to produce a macroscopic-scale crystal.

Two of the common methods in attempting the heterogeneous integration (HI) are (1) heteroepitaxial growth, and (2) layer transfer through wafer bonding. The former involves material research in overcoming mismatches in lattice parameters, crystallographic configurations, and coefficients of thermal expansion among the materials to be integrated together. Notable examples include heteroepitaxy of GaAs on silicon, Ge on silicon, and InAs on GaAs. Method (1) is generally ineffective in supporting the integration of a crystalline layer to a polycrystalline or amorphous substrate. The wafer bonding technique of (2) requires selective substrate removal or layer lift-off techniques together with sophisticated alignment processes. Wafer-bonding has much more flexibility than heteroepitaxy described in (1) but at the expenses of a much higher cost and lower yield. It is therefore only used in highly specialized applications with a very high profit margin.

One approach to preparing crystalline layers on amorphous or polycrystalline substrates has employed artificial epitaxy, or graphoepitaxy[1], which resorts to nanoscale surface patterning, typically through electron-beam lithography, to create geometric boundary conditions on the length scale of nuclei so their orientations can be influenced, if not dictated, by the shape of the nanomolds[2,3]. With all the advances in growth and lithography techniques since then, however, graphoepitaxy has not produced the level of control required by modern device applications.

Gallium nitride (GaN) is a binary III/V direct bandgap semiconductor commonly used in bright light-emitting diodes. The compound has a Wurtzite crystal structure. Its wide band gap gives it special properties for applications in optoelectronic, high-power and high-frequency devices. Choi et al., "Nearly single-crystalline GaN light-emitting diodes on amorphous glass substrates," Nature Photonics 5:763 (2011) describes the preparation of nearly single-crystalline GaN-based light emitting diodes on amorphous glass substrates. A "pre-orienting layer" of thin-film titanium is used to affect the growth direction of a subsequent GaN nucleation layer. Titanium has the same hexagonal crystal lattice as wurtzite GaN. Spatial confinement of nucleation sites was achieved by placing a hole-patterned $SiO_2$ layer on the LT-GaN nucleation layer. GaN arrays were formed on these nucleation sites during high-temperature GaN growth. In the initial stage of high temperature GaN growth (HT-GaN), a number of crystal islands began to grow and compete with one another. These GaN islands have aligned out-of-plane, but there are also random in-plane orientations. The randomness of in-plane orientations inhibits or retards the coalescence of the islands as HT-GaN growth progresses. The nucleation sites can be further confined by reducing the dimensions of the hole, so each hole will only have one dominant island. Using this mechanism, nearly single-crystalline GaN pyramid arrays can be fabricated on amorphous glass substrates through the formation of spatially confined nucleation sites with preferred c-orientation. The GaN pyramid arrays were incorporated into LEDs.

US Patent Application Publication No. 20120025195 relates to confined lateral growth of crystalline material. A lateral growth channel is provided between upper and lower growth confinement layers, and is characterized by a height that is defined by the vertical separation between the upper and lower growth confinement layers. A growth seed is disposed at a site in the lateral growth channel for initiating crystalline material growth in the channel. The seed material can be monocrystalline, polycrystalline or amorphous, though an amorphous morphology is preferred. A growth channel outlet is included for providing formed crystalline material from the growth channel. With this growth confinement structure, crystalline material can be grown from the growth seed to the lateral growth channel outlet. The structure is used to produce single crystal germanium. While the publication states the structures can be applied to any material for which crystalline growth is desired, such as other II-VI as well as III-V polycrystalline and monocrystalline materials can be produced, no actual examples besides germanium are provided, nor are growth conditions provided for other materials. The publication does not refer to the use of a textured thin film, nor does it disclose growing a crystalline material in the growth channel along a direction that is substantially perpendicular to the preferential crystallographic axis of the textured thin film.

McComber et al., "Single-Crystal Germanium Growth on Amorphous Silicon," Adv. Funct. Mater. 22:1049-1057 (2012), presents a method that employs the selective growth of germanium on amorphous silicon by ultra-high vacuum chemical vapor deposition (UHVCVD) at low temperatures (T<450° C.). It reports much of the same information as US Patent Application Publication No. 20120025195, including growth confinement structures where Ge selectively grows from areas of exposed amorphous silicon. The paper states that its work concerns the deposition of polycrystalline germanium (Ge) and concentrates on Ge and its diamond cubic lattice.

US Patent Application Publication No. 20130029472 relates to a gallium nitride (GaN) bonded substrate and a method of manufacturing a GaN bonded substrate in which a polycrystalline nitride-based substrate is used. The method includes loading a single crystalline GaN substrate and a polycrystalline nitride substrate into a bonder; raising the temperature in the bonder; bonding the single crystalline GaN substrate and the polycrystalline nitride substrate together by pressing the single crystalline GaN substrate and the polycrystalline nitride substrate against each other after the step of raising the temperature; and cooling the resultant bonded substrate. Thus, the single crystalline GaN substrate and the polycrystalline nitride substrate are grown separately and bonded together.

Liv et al., "High-quality single-crystal Ge on insulator by liquid-phase epitaxy," Applied Physics 84(14): 2563 (2004) discusses a single-crystal germanium layer grown on a nitride insulator. A nitride layer was formed on a crystalline silicon substrate with a seeding window, then Ge was sputtered onto the nitride and the silicone through the seeding window. A low-temperature oxide was deposited over the Ge, forming a micro crucible. The silicon substrate was heated to 940° C., causing the Ge to melt. Upon cooling, a single-crystal Ge grew from the Ge/Si interface in the seeding window, extending over the nitride.

The growth of device-quality single crystal GaN on an amorphous or polycrystalline substrate remains an unmet challenge, one which could provide tremendous benefits in the fields of optoelectronics, microelectronics and others.

SUMMARY

As one aspect of the present invention, methods are provided for generating a crystalline material. The methods comprise depositing a textured thin film in a growth seed area, wherein the textured thin film has a preferential crystallographic axis; providing a growth channel extending from the growth seed area, the growth channel permitting guided lateral growth; and growing a crystalline material in the growth channel along a direction that is substantially perpendicular to the preferential crystallographic axis of the textured thin film. The growth channel permits guided later growth of a material that is initially polycrystalline, but through evolutionary selection, the material will be a single crystal material if the growth channel has sufficient length. In some preferred embodiments, the crystalline material is gallium nitride, and the textured thin film comprises a nitride such as aluminum nitride or titanium nitride.

As another aspect of the present invention, methods are provided for generating a crystalline material on a substrate. The methods comprise depositing a textured thin film (for example, aluminum nitride or titanium nitride) in a growth seed area of a substrate. The growth seed area has a first width. The methods also comprise providing a growth channel on the substrate connected to the growth seed area. The growth channel has a second width less than the first width. The methods can also comprise providing a growth area on the substrate connected to the growth channel. The growth area has a third width that is greater than the second width. The methods comprise selectively growing a crystalline material (for example, gallium nitride) from the growth seed area and continuing through the growth channel such that the multiplicity of orientations in the crystalline material lessen as the growth of the crystalline material extends farther from the growth seed area, wherein the crystalline material in the growth area has a single orientation. Preferably, a crystalline material consisting of a single crystal is grown at a far end of the growth channel. Thus, the seed material (the textured thin film) can be a different material than the crystalline material. The crystalline material in the growth area can be a film or layer where the lateral dimensions are substantially greater than the vertical dimensions. The growth channel can be formed by depositing a grooved dielectric layer on the textured thin film or a substrate. The methods can further comprise depositing a vertical confinement layer above the growth channel and optionally above the growth area such that the growth of the crystalline material is vertically confined at least through the growth channel and optionally in the growth area.

In some preferred embodiments, the crystalline material is gallium nitride. Examples of preferred textured thin film comprises aluminum nitride, titanium nitride or metal films. Examples of preferred substrates include silicon and silicon dioxide. In some preferred embodiments of the present methods, the crystalline material is gallium nitride, the textured thin film comprises aluminum nitride or titanium nitride, and the substrate comprises silicon or silicon dioxide. In some embodiments of the present methods, a single crystalline material is grown on an amorphous substrate (for example, silicon dioxide) such that the crystalline material and the substrate are heterogeneously integrated.

In some embodiments of the present methods, the methods also include the step of generating a crystalline material from a polycrystalline material by evolutionary selection within the growth channel. The polycrystalline material is grown from the growth seed area and has a multiplicity of crystal orientations. For example, the methods can comprise selectively growing a polycrystalline material from the growth seed area and continuing through the growth channel such that the multiplicity of orientations in the polycrystalline material lessen as the growth extends farther from the growth seed area in the growth channel, thereby providing the crystalline material having a single orientation from the polycrystalline material. Suitable growth processes used to extend the crystalline material from the seed into the growth channel include metalorganic chemical vapor deposition, hydride vapor phase epitaxy, molecular beam epitaxy or liquid phase epitaxy.

In some embodiments of the present methods, the textured thin film is deposited such that a portion of the thin film is connected to the growth channel to provide a growth seed area. The portion of the thin film that provides the growth seed area can be a side surface or a top of the textured thin film.

In some embodiments, the growth channel is formed by patterning the textured thin film into one or more desired thin film patterns; covering those thin film patterns with dielectric material to form a dielectric cover having at least a first end and a second end; removing at least a portion of the first end of the dielectric cover so as to expose an edge of the thin film pattern; and removing a first portion of the textured thin film from under the dielectric material to form a tunnel while leaving a second portion of the textured thin film within the second end of the dielectric cover. The second portion of the textured thin film has a surface that serves as the growth seed area. The portion of the textured thin film that provides the growth seed area can be a top surface or a side surface.

In another embodiment of the present methods, when the portion of the textured thin film that provides the growth seed area is a top surface of the textured thin film, the growth channel is formed by covering the textured thin film with a first dielectric layer having a top surface, opening a window to form a growth seed area, covering the top surface of the first dielectric layer and the growth seed area with a sacrificial layer, patterning the sacrificial layer into desirable shapes with one portion connected to the growth seed area, depositing a second dielectric layer on top of the sacrificial layer, performing another patterning to expose the edge of the sacrificial layer, and removing the sacrificial layer to form a channel defined by the first and second dielectric layers connected to the growth seed area.

As yet another aspect of the present invention, a growth structure for generating a crystalline material is provided. The growth structure comprises a growth seed area comprising a textured thin film (for example, aluminum nitride or titanium nitride) disposed on a substrate (for example, silicon or silicon dioxide), the growth seed area having a first width, the growth seed area is adapted for initiating growth of a crystalline material; a growth channel connected to the growth seed area, the growth channel having a second width equal to or less than the first width, wherein the growth channel is adapted for extending growth of the crystalline material from the growth seed area through the growth channel such that the multiplicity of orientations in the crystalline material lessen as the growth of the crystalline material extends farther from the growth seed area. In some embodiments, the growth channel is defined by a grooved dielectric layer disposed on the substrate. The growth structure can also include a vertical confinement layer disposed above the growth channel and optionally above the growth area such that the growth of the crystalline material is vertically confined at least through the growth channel and optionally above the growth area. In some embodiments, the growth seed area, the growth channel, and the growth area are each defined at least partially by a dielectric material.

This disclosure describes methods for generating crystalline materials, and these methods can be used for the integration of a functional (such as electronic or photonic) crystalline device layer with different substrates (crystalline, polycrystalline, amorphous, silicon, quartz, or other substrate) through the combination of (1) preparation of a textured thin film on a substrate, (2) fabrication of a dielectric or metal mask on top of the said thin film with openings as seed windows as well as channels (which also encompasses trenches and grooves) created within the mask (with the bottom of the grooves still made of dielectric or metal), and (3) selective area growth of the device layer from the seed windows followed by lateral guided growth into the grooves during which the lateral growth will cause orientation selection so the layer further down the guided-growth channel will exhibit improved crystallinity, eventually reaching a level of quasi-single crystalline for subsequent device fabrication.

BRIEF DESCRIPTION OF THE FIGURES

FIG. 5A shows inclined SEM of $SiO_2$ stripe pattern tunnel substrates before and after lateral undercut etch of the sputtered AlN seed by TMAH. FIG. 5B shows a top view SEM, constrast from underneath the top $SiO_2$ layer showing the depth of the AlN front and FIG. 5C before and after removing the $SiO_2$ to expose the (0001) textured AlN seed that serves as the first orientation selection template for GaN.

FIG. 6A shows 2 μm width tunnel patterns 602, FIG. 6B shows 4 μm width tunnel patterns 604, FIG. 6C shows 8 μm width tunnel patterns 606 and FIG. 6D shows 16 μm width tunnel patterns 608 1208 after GaN growth. GaN growth duration is long enough that the growth fills and extends outside the tunnel, (tunnel depth <5 μm, 1 hr growth at 1030° C., 15 sccm TMGa, 2 slm NH3, 100 mbar).

FIGS. 7A to 7C show morphological analyses and diffractive pole figures GaN growth on $SiO_2$, on an AlN layer, and in a growth tunnel.

FIGS. 9A and 9B provides photographs of transmission electron microscopy (TEM) performed on the GaN crystals.

FIG. 10A shows laterally unconstrained growth of GaN from textured AlN seed. FIG. 10B is an EBSD characterization which shows the grain evolution.

FIG. 12A shows a growth tunnel with 60° bends 1202. FIG. 12B shows a growth tunnel with 90° bends 1204. FIG. 12C shows a growth tunnel with 120° bends 1206.

DETAILED DESCRIPTION

The present disclosure provides methods for generating a crystalline material from a textured thin film, including methods for generating a single crystal material on an amorphous substrate. A textured thin-film as used herein refers to a film of crystalline grains of less than micrometer dimensions (less than 1 μm), preferably nanometer dimensions (that is, of the scale of 10 to 500 nm) which have a preferential but non-uniform crystallographic orientation. The present disclosure provides methods for generating a crystalline material from a textured thin film, wherein the crystalline is grown along a direction that is substantially perpendicular to the preferential crystallographic axis of the textured thin film.

A growth channel as used herein refers to a channel, groove, tunnel or other confinement having a length greater than its width or height. Preferably the growth channel as a lateral to vertical ratio ($v_{lateral}/v_{vertical}$) that is greater than or equal to 5. In some embodiments, the growth channel has a width that is from 10 to 200 times, alternatively 10 to 50 times, the size of the nuclei (crystallites) of the textured thin film. The length of the growth may be based on the characteristic length in evolutionary selection and is sufficient to provide that the crystalline material growing at or near the far end of the channel consists of a single crystal. The growth channel is adapted to remove or lessen degrees of freedom in grain orientations of the textured thin film, for example, by removing one, two or three degrees of freedom. In some embodiments, the growth channel has an hour-glass shape or a narrower width in a middle portion. In some embodiments, the growth channel has bends having an angle between about 30° and about 150°, alternatively between about 60° and about 120°. More particularly, a growth channel in any of the embodiments has one or more bends having an angle of 30°, 40°, 45°, 50°, 60°, 70°, 75°, 80°, 90°, 100°, 105°, 110°, 120°, 130°, 135°, 140°, 145°, and/or 150°.

Figures 1A, 1B, 1C:
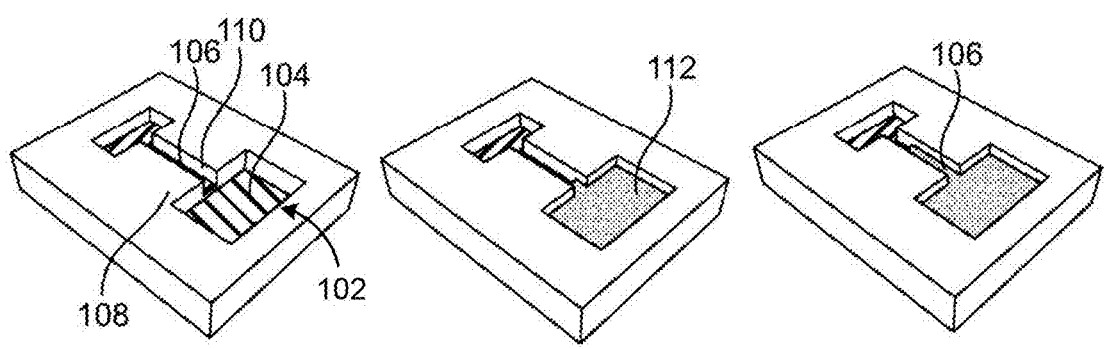
FIGS. 1A to 1E are schematic drawings illustrating the idea of guided lateral overgrowth of a crystalline material.

FIGS. 1A to 1E show how a growth channel can be configured and an embodiment of a method of guided epitaxial growth can be carried out. FIG. 1A depicts how a growth window or seed area 102 (a via window exposing the underlying crystalline or textured layer 104) and an interconnected dielectric channel 106 (a shallow grooved pattern created into a dielectric layer) are created. The height difference between the channel and the seed area is around 100 nm. The seed layer 104 has a unique property; it is a strongly textured nature, sometimes called fiber-textured. See, for example, G. Abadias, "Stress and preferred orientation in nitride-based PVD coatings", Surface and Coating Technology 202, 2225-2235 (2008). The majority of the grains are strongly orientated along a preferred axis but normally there is no in-plane alignment (see a graphic plan-view representation in FIG. 3A).

Figures 1D, 1E:
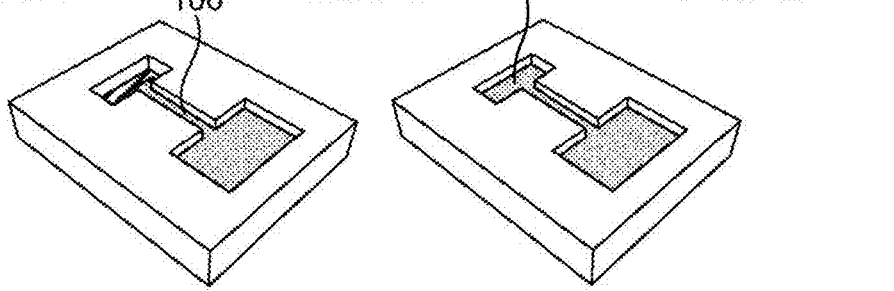

During the subsequent growth, as the surface is largely masked by dielectric materials 108 with an inert surface (including both the bottom surface log and lateral surfaces 110 in FIG. 1A, selective-area growth will take place within only the seed area 102. Adatoms will only be added to the seed region through both vertical and horizontal growth, depicted as 112 in FIG. 1B. Growth conditions should be carefully selected to suppress the growth velocity along the fiber-texture axis while enhancing the growth velocities in the in-plane directions. While the height of the layer within the seed window only increases in a limited way, a substantial lateral growth is expected to take place within the channel (FIGS. 1C and 1D), thus the term "guided growth" is derived. Crystal growth in the growth channel will be along a direction that is substantially perpendicular to the preferred crystallographic axis of the textured thin film. The lateral growth of fiber-textured grains within the channel (FIGS. 1C and 1D) represents an important aspect of the present disclosure, as an orientation selection process (A. van der Drift, "Evolutionary selection, a principle governing growth orientation in vapour-deposited layers", Philips Res Repts 22, 267-288 (1967) is expected to take place horizontally. In FIG. 1E, the crystalline material has grown into a growth area 114 having a width that is greater than the width of the growth channel 106. In the growth area 114, a single crystalline material can be formed as a layer or film.

Figures 2A, 2B, 2C:
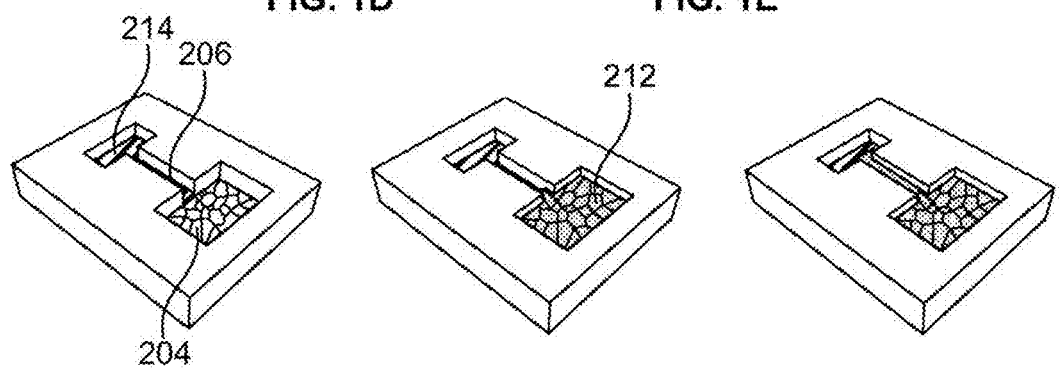
FIG. 2A shows an "open channel" configuration for ES-SAG growth, where (1) a $SiO_2$ mask is photolithographically defined on a textured substrate, (2) SAG on the exposed template region, and (3) lateral overgrowth over the $SiO_2$ channel, which is constrained in the opposite lateral direction.
FIG. 2B) are inclined SEM images of growths performed with single crystal GaN as a template, with a lateral overgrowth length of about 2 μm, with thickness of 400 nm ($v_{lateral}/v_{vertical}$<5).

FIG. 2A also shows schematic drawings of a growth structure having a textured thin film 204 in a growth seed area, a growth channel 206, and a growth area 214. Adatoms 212 are initially added vertically on the textured thin film, followed by horizontal growth through the growth channel 206.

The crystalline material grown through a laterally constrained open channel, as shown in the SEM images in FIG. 2B. With a textured seed, the c-oriented GaN will laterally extend over the amorphous mask by use of growth conditions to enhance the $v_{lateral}/v_{vertical}$ growth rate ratio. The preferred maximum ratio of about 5 was obtained with growth conditions of 1100° C., 50 mbar, 5 sccm TMGa and 1 slm $NH_3$ under $N_2$ carrier gas. However, a prohibitively thick $SiO_2$ mask would be required to constrain the growth and at the same time enable larger area GaN. Thus, vertical confinement is added in preferred embodiments of the method. Preferred growth conditions include temperatures in the range of about 900° C. to about 1100° C., alternatively about 1030° C., and pressures in the range of about 50 mbar to about 300 mbar, alternatively about 100 mbar.

Figures 3A, 3B, 3C:
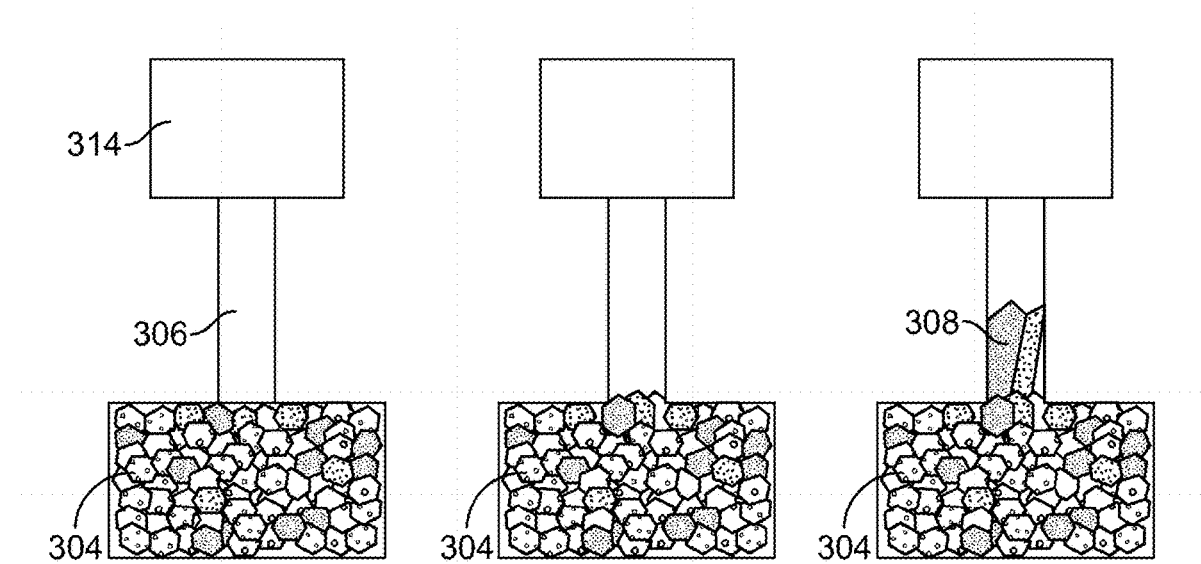
FIGS. 3A to 3E are top-view schematic drawings depicting growth and orientation selection during lateral guided growth.
Figures 3D, 3E:
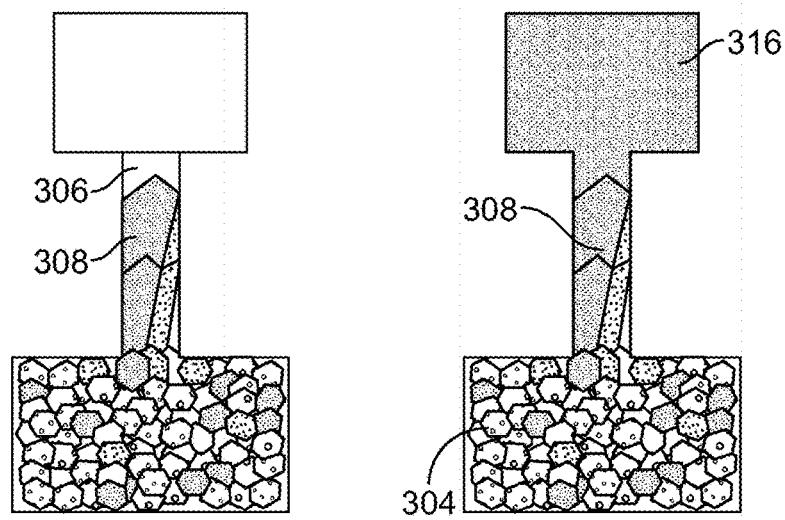

FIG. 3A illustrates a fiber-textured seed window 304 exposing oriented yet misaligned (in-plane) grains, denoted by different shading. FIGS. 3B & 3C illustrate initial stages of lateral guided growth since the growth channel 306 is the only viable space for layer growth; orientations with the fastest growth velocity will gradually dominate the growth front. FIG. 3D illustrates that, as the guided growth proceeds, there will be a gradual "down selection" or "filtering" of grains 308, eventually reaching a stage of single grain growth with an appropriate choice of the width and length of the guided channel 306. This phenomenon is sometimes called necking. FIG. 3E illustrates further development of the filtered grain into a large-area, single crystalline layer 316 in the targeted semiconductor-on-insulator region. The large-area, single crystalline layer is formed in the growth area 314.

The microstructural evolution that takes place within the channel 306 is illustrated schematically in FIGS. 3C and 3D. It is expected that the misaligned grains adjacent to the channel will have the opportunities to grow laterally. In contrast to the typical orientation selection described in Van der Drift that takes place vertically, or parallel to the surface orientation, the guided growth here represents a novel implementation of orientation selection, where crystalline material is generated perpendicularly to the surface orientation of the textured thin film, ultimately causing the formation of a single crystalline region 314 that is some distance away from the original seed window 304.

Figure 2D:
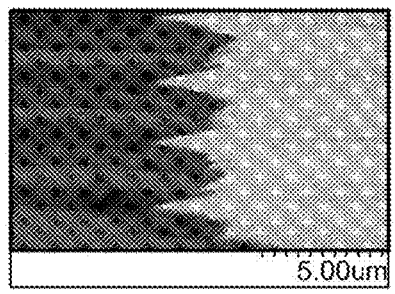
Figure 2E:
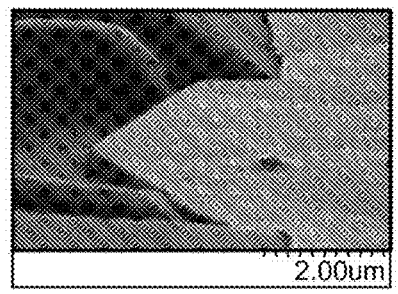

This process described above enables the preparation of single crystalline semiconductor from a textured thin-film, including a fiber-textured thin film. It is well known that many metal and nitride thin films, when deposited at low temperatures (<0.3 $T_{M.P.}$) on amorphous or crystalline substrates, will develop into a fiber textured morphology. Taking advantages of such a known phenomenon (summarized in Abadias) in inducing crystallographic alignment along one axis on essentially arbitrary substrates, the guided, selective-area, and channeled growth (FIGS. 1-3) is utilized to drastically reduce the in-plane (orthogonal) misalignment to obtain single-crystalline device layers on essentially any substrates.

While this principle can be applied to many possible sets of (substrates, fiber-textured layer, device layer) combinations, one preferred choice would be the preparation of device quality GaN through lateral guided growth on sputtered AlN ((0001) textured) or TiN ((111) textured) on oxide on Si (001) that will integrate two mainstream technologies, the silicon-based microelectronics and GaN-based opto- and power-electronics. As a preferred aspect, methods of generating single-crystalline GaN on amorphous templates are provided herein.

Figure 4A:
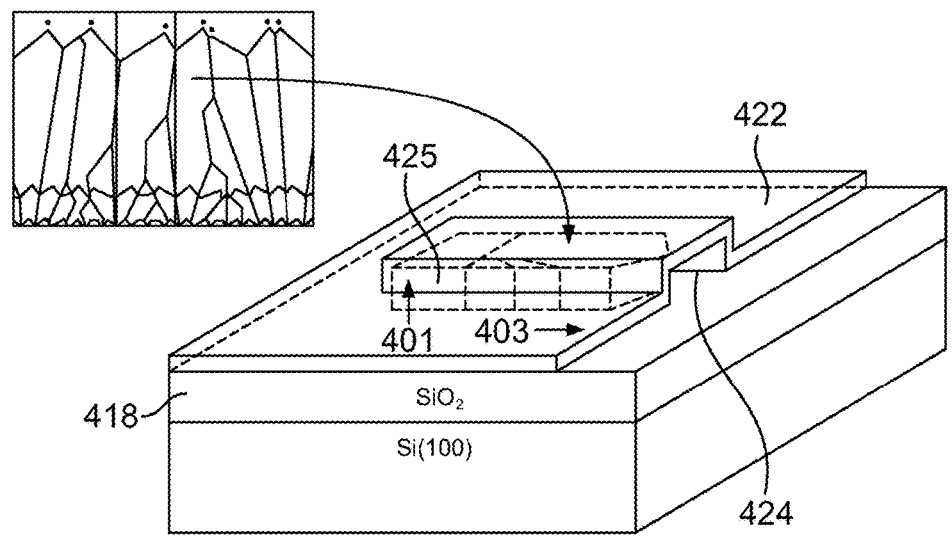
FIGS. 4A to 4C illustrate other embodiments of a method of generating a crystalline material within a growth channel (in this case, tunnels of various shapes).

The present disclosure demonstrates single crystal growth on amorphous oxide by exploiting evolutionary selection growth, which is responsible for the formation of polycrystalline and textured thin films. Another embodiment of a method of generating a crystalline material within a growth channel (a tunnel) is illustrated in FIG. 4. With the successive applications of evolutionary selection along two perpendicular axes (FIG. 4A). First vertically in Step 1 and then horizontally in Step 2, the degrees of freedom in grain orientations are removed, resulting in the preparation of single-crystalline GaN on a $SiO_2$/Si(100) template. The conceptual model of evolutionary selection is confirmed by the modeling of growth dynamics and provides a universal procedure in forming crystalline layers on amorphous substrates.

Figure 4B:
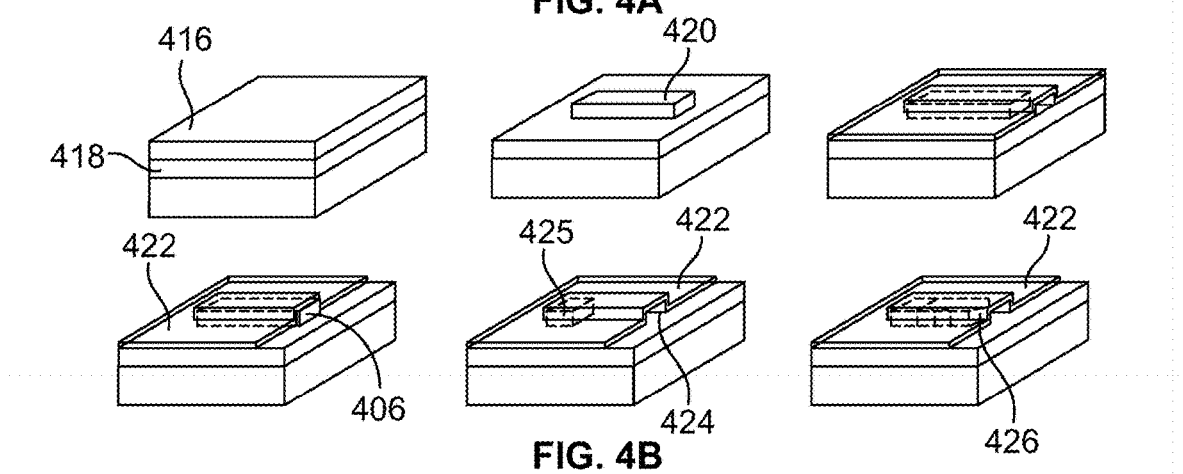
Figure 4C:
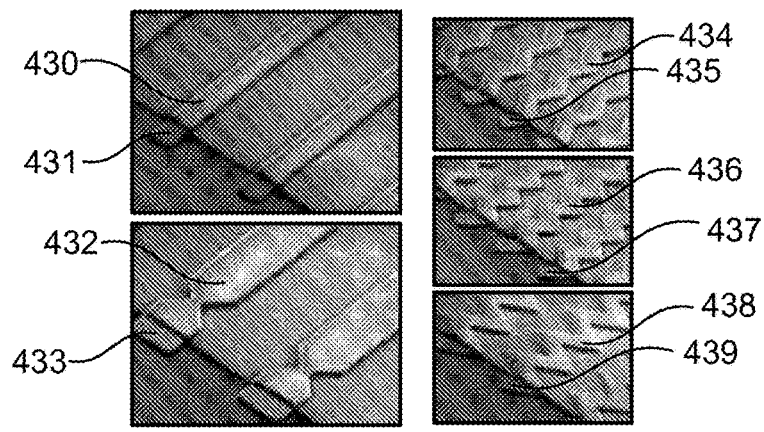
Figure 12A:
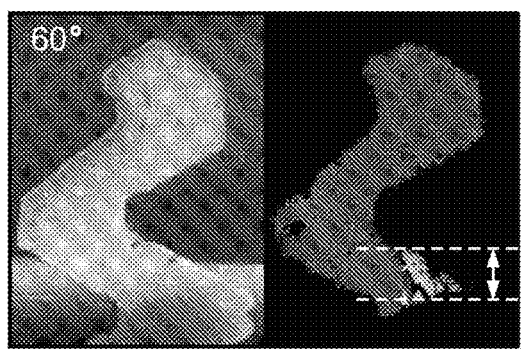
FIGS. 12A to 12C show growth tunnels of various designs.
Figure 12B:
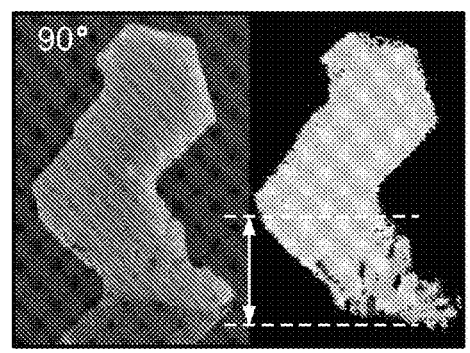
Figure 12C:
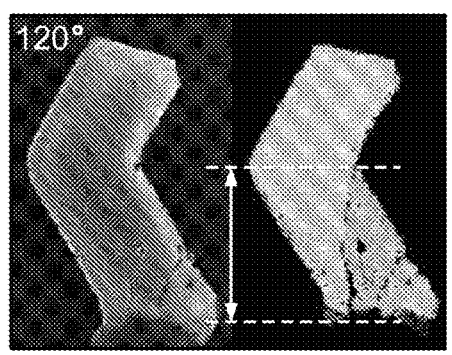

FIG. 4 shows the concept and fabrication of a $SiO_2$ tunnel structure. FIG. 4A provides a schematic of the concept used here. Growth proceeds in two steps: (1) vertical deposition 401 of a textured AlN 416 on a $SiO_2$/Si(100) substrate 418, and (2) longitudinal metal-organic chemical vapor deposition (MOCVD) growth 403 of GaN. In step (2) the initial nucleation is randomly oriented and polycrystalline, and will undergo an evolutionary selection process (left, after [10] van der Drift) that results in single crystalline GaN. Other techniques for growth can be used, such other chemical vapor deposition (CVD) techniques. FIG. 4B shows processing flow of the $SiO_2$ tunnels. A layer of AlN 416 is deposited in the substrate 418, then patterned (using lithography or another technique) into one or more thin film patterns 420. The pattern 420 is then covered with a dielectric cover 422. At least a portion of a first end of the dielectric cover 422 is removed so as to expose an edge of the thin film pattern 406. A portion of the textured thin film is removed from under the dielectric cover to form a tunnel 424, but a portion is kept to provide a seed. Single crystalline GaN 426 is generated in the tunnel. FIG. 4C is inclined SEM images 430, 432, 434, 436 and 438 of the completed tunnel fabrication, with exposed AlN 431, 433, 435, 437 and 439 at the ends. Characterization of growth in patterns on the left are shown in FIG. 9, and results in the patterns on the right (angled at 60°, 90° and 120° are shown in FIGS. 12A to 12C). The scale bar is 20 μm.

The present methods employ a dielectric cover fabricated to confine the subsequent growth in two directions. FIG. 5 shows a photograph of a fabricated $SiO_2$ growth mask 502 defining several growth tunnels 506 after the AlN has been laterally undercut etched 503. The undercut AlN is better seen after the $SiO_2$ has been removed 505.

While single crystalline material is obtained within the tunnel as measured by EBSD, another indication of crystallinity can be seen by growth outside the tunnel, by an extended duration of MOCVD growth of GaN. FIG. 6 shows photographs of GaN crystals 601, 603, 605, and 607 generated in growth tunnels 602, 604, 606, and 608 and extending out of those tunnels. FIG. 6A shows growth tunnels 602 having a width of 2 μm. Most of the crystals extend out of the tunnel exhibit one or more components with six-fold symmetry, reflecting the symmetry of the wurtzite GaN unit cell. Vertical facets (m-plane) bound the crystal. The number of crystals that are present at the opening of the tunnel increase with tunnel width (with mostly single crystal for the 2 μm and 4 μm tunnel width, and 2 or more crystals for 8 μm and 16 μm), which is due to incomplete filtering of the additional nucleated grains for the wide tunnels.

Deposition of thin films on amorphous substrates does not need to be, as one might expect, always disordered and amorphous. There are instances that textured thin films can be formed spontaneously on arbitrary substrates[4,5,6,7]. These textured films consist of fibrous grains with a preferential axis oriented along the growth direction yet with no in-plane (transverse) alignment. The origin of the spontaneous formation of orientation with the increase of film thickness was explained by the model of "evolutionary selection" (ES)[8]. According to this model the randomly oriented nuclei grow and undergo a competitive, geometric selection process; nuclei with their fastest growing axis oriented obliquely from surface normal are blocked (or filtered out) by adjacent nuclei with better on-axis alignment, thus creating a "survival of the fastest" phenomenon. While these textured thin films are in essence polycrystalline and have not been considered for active devices, the mechanism associated with their formation offers a unique pathway to non-epitaxial growth of single crystalline layers on amorphous substrates.

FIG. 7 shows GaN growth under differing conditions. FIG. 7A is a photograph of the direct deposition of GaN on $SiO_2$. Pole figure, bottom, indicates random orientation of GaN crystals. FIG. 7B is a photograph of GaN grown on sputtered AlN and it forms c-axis oriented grains following the orientation of the AlN template. A distinct [0001] orientation, but random in-plane orientation, of the GaN is shown in the pole figure below. FIG. 7C shows that the present methods can be used to grow single crystals of GaN of defined location and size. The pole figure of one of these crystal is shown below. The scale bar for SEM images is 20 μm.

The orientation of an arbitrary grain possesses three degrees of freedom: polar, azimuthal, and rotational/twist[8]. This can be seen by typical growth of semiconductors on oxide or amorphous templates, which result in the formation of randomly oriented crystallites, as shown in FIG. 7A for GaN deposited on $SiO_2$. The surface exhibits large isolated discrete crystallites nucleated on the $SiO_2$ mask, and the pole figure (FIG. 7A) confirms their random orientation. No mechanism rendering orientational guidance exists for the GaN crystallites during nucleation or growth on SiO$_2$, thus all three degrees of freedom in orientation are retained. The challenge of growing crystal on amorphous templates is formulated as a task to control and reduce the degree of freedom from three (completely random) to zero (single crystalline) with no need of crystalline underlayers. This disclosure discusses the concept and results of successive applications of evolutionary selection, along two orthogonal axes, such that single crystalline layers within a confined geometry can be obtained on an amorphous surface. This concept is illustrated in FIG. 4A. Without a loss of generality, GaN was chosen as an example for the evolutionary selection study. The importance of GaN in opto- and power electronics is well established[9,10]. A particular need that has received much attention but has not been solved before the present disclosure is the heteroepitaxial integration of GaN with mainstream Si technology. This aspiration faces major challenges including mismatches in lattice and thermal expansion constants[11], the problem of chemical reactivity[12], and the current leakage through conductive Si substrates[13]. By combining two processes in thin-film growth: evolutionary selection and selective-area growth (ES-SAG), the possibility is hereby validated of a non-epitaxial route to crystalline layers through the demonstration of dislocation-free, device quality GaN on amorphous SiO$_2$ on Si(100).

To implement the concept of evolutionary selection for the growth of GaN on SiO$_2$, a textured AlN thin film was initially deposited. It has been shown that during the sputtering of nitride films, including TiN[14,15], ZrN[16] and AlN[14,17], a preferred orientation develops as the film grows thicker. The formation of such a fibrously textured thin film effectively reduces the degrees of freedom from three to one. However, morphological analysis and the diffractive pole figure of GaN grown on such AlN layer (FIG. 7B) indicate the orientation distribution along c-axis is retained, but the same random in-plane orientation exists. The fact that in-plane alignment is not established makes such textured layers generally unsuitable for device applications, with the exception of micro-arrayed devices reported recently[18].

To eliminate the remaining degree of freedom, evolutionary selection growth of GaN was considered along a direction perpendicular to the first growth axis while using the initial AlN template as a textured seed. To facilitate the filtering process, horizontal (perpendicular) ES growth was carried out with a confined geometry, as depicted in FIG. 4, where the confined incorporation of reactants is enabled by the principle of selective area growth (SAG). A "growth tunnel" 424 with an additional vertical confinement is used, due to the limited vertical-to-horizontal ratios in growth rates[19] ($v_{vertical}/v_{horizontal} \leq 5$, FIG. 3) which inhibit the ability to form large enough area within a reasonable film thickness[20,21]. In this way, the thickness of the layer produced by ES growth can be controlled to remain thin, but the distance of ES growth (along what we call the longitudinal axis) will have no practical limit in length.

A schematic diagram of a fabrication process flow for growth tunnels and the subsequent ES-SAG growth as a method of generating a crystalline material is illustrated in FIG. 4B. Briefly, a PECVD SiO$_2$ layer 402 is deposited on top of lithographically defined AlN stripes of different patterns 404 (FIG. 4B (iii)). The SiO$_2$ layer 402 is removed at the ends of the patterns to expose a portion of the AlN 406 (FIG. 4B (iv)). Examples of fabricated AlN tunnels are shown in FIG. 3b, with the exposed AlN shown 406. AlN is then selectively etched underneath the SiO$_2$ mask 402, resulting in a growth tunnels 424 bound by SiO$_2$ in transverse (lateral and vertical) directions (FIG. 5), allowing only longitudinal SAG. A portion of AlN is retained to serve as a textured thin film seed. The fabricated tunnels are then cleaned and loaded into a MOCVD reactor for GaN growth. The sputtered AlN thus serves dual purposes as a filler (cast) to define the tunnel geometry and as a seed for horizontal ES growth.

FIG. 8 shows characterization of GaN growth. FIG. 8A contains an electron backscatter pattern from a single spot about 6 μm from the interface, and mapping to wurtzite GaN crystal is shown below. FIG. 8B shows GaN growth in a straight tunnel shape (such as FIGS. 1C, 4C top left), top view SEM and corresponding inverse pole figure measured by EBSD. FIG. 8C shows GaN growth in an hour-glass designed tunnel shape (such as FIG. 4C, bottom left), narrowing in width (2.2 μm) from the initial width of the AlN seed (4.5 μm), and extending back out in width. The scale bar is 2 μm.

Figure 8A:
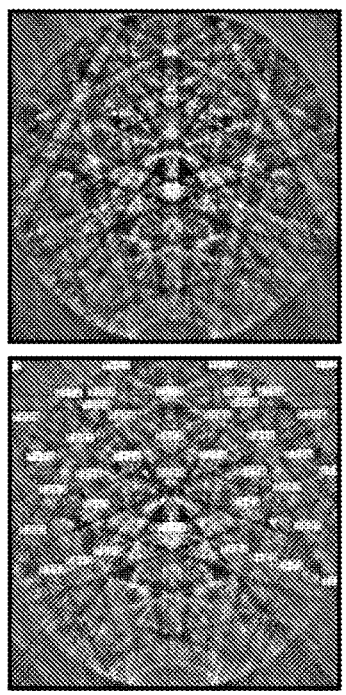
FIGS. 8A to 8C show characterizations of GaN grown by evolutionary selection in a growth tunnel.
Figure 8B:
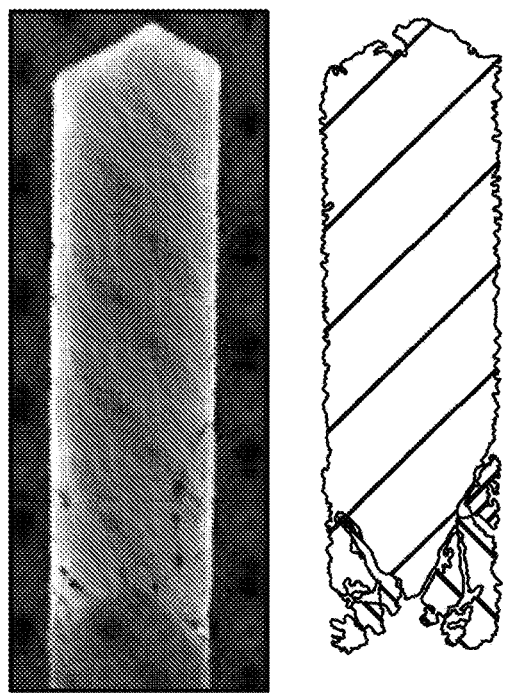
Figure 8C:
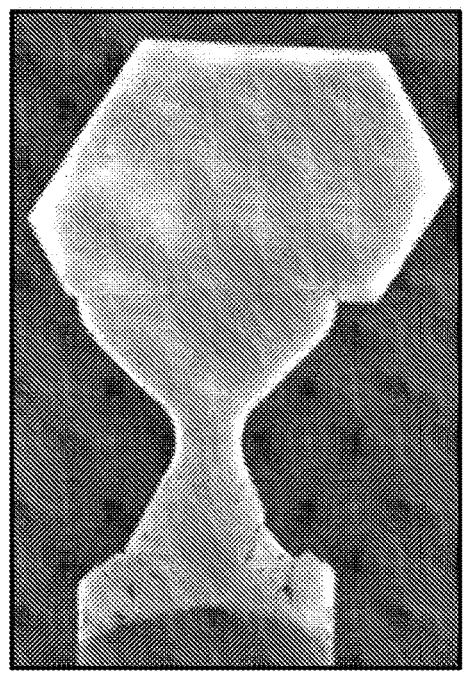
Figure 8C:
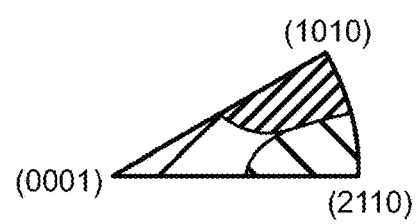
Figure 8C:
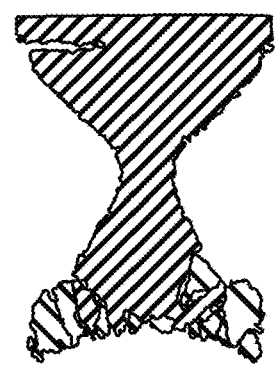

FIGS. 8A and 8B summarize the characterization of a particular ES-grown GaN having a tunnel geometry of 4 μm, 0.65 μm and 20 μm in the lateral and vertical dimensions and depth, respectively. An electron backscatter pattern is obtained approximately 6 μm from the interface with the presence of clear and higher order Kikuchi bands confirming the single crystallinity and providing orientational indexing of GaN (c-axis oriented in agreement with the preferred axis of AlN). The dynamics of ES growth is revealed by EBSD inverse pole figure (IPF) mapping along the entire length of the GaN stripe, tracing the evolution from polycrystalline nucleation on AlN to a uniformly single-crystalline grain over a distance of ~4 μm by evolutionary selection. A clear c-axis alignment juxtaposed with in-plane six-fold symmetry in the pole figure of mapped spots (FIG. 4C) indicate that single crystallinity is achieved on an amorphous template. Increasing growth time, the crystal extending out of the tunnel opening exhibits the expected six-fold symmetry of single crystal wurtzite GaN (FIG. 6). In addition to straight tunnel patterns, variations have been designed, as shown in FIG. 4C and FIG. 12, to affect the evolution of grains from the seed. Design considerations have included the filtering of grains by an hour-glass shaped constriction in the tunnel width, as demonstrated in FIG. 8C, and the subsequent enlargement of width to allow large areas of GaN. In a preliminary study, single-crystalline GaN as large as 10×20 μm$^2$, subject to the initial mask designs, can be routinely obtained on SiO$_2$.

FIG. 9 shows Transmission electron microscopy (TEM) analysis of the single crystalline GaN generated by the present methods. FIG. 9A is a plan-view bright-field TEM image taken in [0001] zone-axis orientation, showing sputtered AlN 902, a dislocation cluster 904, and GaN 906. FIG. 9B is a plan-view HR-TEM image of GaN. Near the interface between GaN and sputtered AlN seed, clusters and array of dislocations were observed. Dislocations created at the interface, due to lattice mismatch, can propagate through single crystal grains and interact with each other. Grain boundaries usually hinder the movement of dislocations, creating a pile-up at the boundary[22]. No dislocations were observed for the samples imaged several μm away from the interface. Selected area electron diffraction (FIG. 9A inset) and plan-view high-resolution TEM confirms single-crystallinity of the GaN and show the hexagonal six-fold arrangement of wurtzite GaN.

FIG. 10 shows laterally unconstrained growth of GaN from textured AlN seed. Thus, the ES-SAG growth of GaN has no lateral (in-plane) confinement, but still retains an upper 'ceiling' for vertical confinement. FIG. 10A is an SEM image and FIG. 10B is an EBSD characterization which shows the grain evolution. The orientation and grain information obtained from EBSD is input into simulation obeying ES growth rules, and overlayed on the SEM image in FIG. 10A. The solid lines denote grain boundaries, and the dashed lines and shading denote the growth front in the longitudinal direction.

It is clear that the thin film remains polycrystalline across the entire length of the growth, thus underscoring the necessity of lateral confinement. From EBSD, the position and specific in-plane orientation of each grain (FIG. 10B) are found, and these initial conditions are input into simulation of growth obeying ES selection rules[8,23] (FIG. 13), and overlayed with the SEM (FIG. 10A). The agreement of the simulated grain morphology based on the EBSD orientation map provides a quantitative support to the claim that evolutionary selection is responsible for the realization of single crystalline GaN on $SiO_2$.

Non-epitaxial formation of single-crystalline GaN on $SiO_2$ has been reported by combining the concept of evolutionary selection (ES) with selective area growth (SAG). The ES-SAG method lifts the requirement for an epitaxial template to be present for the formation of device quality semiconductor layers. While the single-crystalline GaN is not a continuous layer at present, its size and position is precisely controlled by lithography and the area can exceed tens to hundreds of square micrometers, thus is uniquely suitable for the heterogeneous integration effort of III-V semiconductors and Si CMOS. Thus, a method of generating a crystalline material having an area greater than 10 $\mu m^2$, alternatively greater than 20 $\mu m^2$, alternatively greater than 50 $\mu m^2$, alternatively greater than 100 $\mu m^2$, alternatively greater than 200 $\mu m^2$, alternatively greater than 500 $\mu m^2$, is provided. The crystalline material can be a III-V material such as GaN, and/or can be heterogeously integrated with a substrate such as silicon semiconductors.

Figure 11:
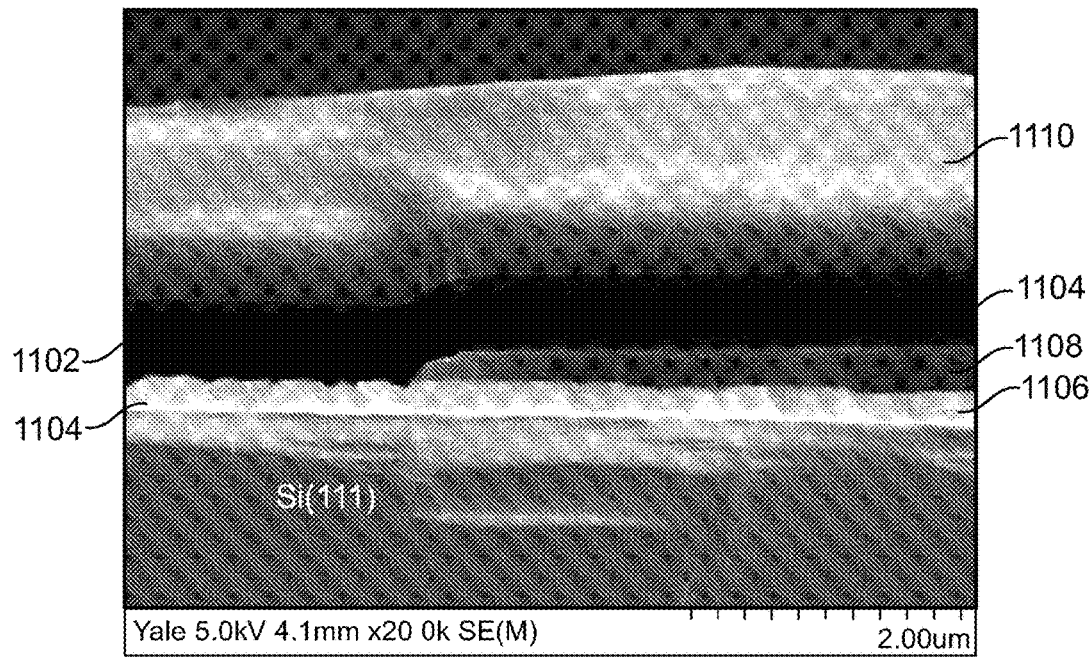
FIG. 11 shows an image of a growth seed area 1102 that permits evolutionary selection growth from a top surface rather than side of the AlN seeds into a growth channel 1104.

FIG. 11 shows the fabrication process flow for evolutionary selection growth from a top surface rather than side of the AlN seed material 1106. A window 1102 for selective area growth is provided above the top surface of the AlN textured thin film 1106. A material can crystallize (likely by forming textured crystallites) on the top surface of the AlN seed 1106, and then grow laterally through a growth channel such as the lateral growth guide 1104 shown in FIG. 11. The lateral growth guide 1104 can be formed by covering the textured thin film with a first dielectric layer 1108 having a top surface, opening a window to form a growth seed area, covering the top surface of the first dielectric layer and the growth seed area with a sacrificial layer, patterning the sacrificial layer into desirable shapes with one portion connected to the growth seed area, depositing a second dielectric layer 1110 on top of the sacrificial layer, performing another patterning to expose the edge of the sacrificial layer, and removing the sacrificial layer to form a channel defined by the first and second dielectric layers connected to the growth seed area.

The ability to change the growth filtering process by changing the tunnel shape is demonstrated in FIGS. 12A through 12C. Here, the tunnel has bends 1202 of 60°, in order manipulate the length in which the single crystal dominates. FIG. 12A shows a growth tunnel designed with a 4 μm width and 60° bends 1202. FIG. 12B shows a growth tunnel designed with a 4 μm width and 90° bends 1204. FIG. 12C shows a growth tunnel designed with a 4 μm width and 120° bends 1206. It is seen with a sharper bending angle, the distance in which all the grains are eliminated is reduced (from 8 μm to 5.3 μm to 2.1 μm for bending angle reduced from 120° to 90° to 60°, respectively). Due to the shadowing effect, grains closer to the side perpendicular to the growth direction interact with the $SiO_2$ sidewall and are blocked from propagation. In FIGS. 12A to 12C, SEM and corresponding EBSD analysis of the grains show that the bending angle is effective in reducing the length in which a single crystal grain of GaN dominates.

Figure 13A:
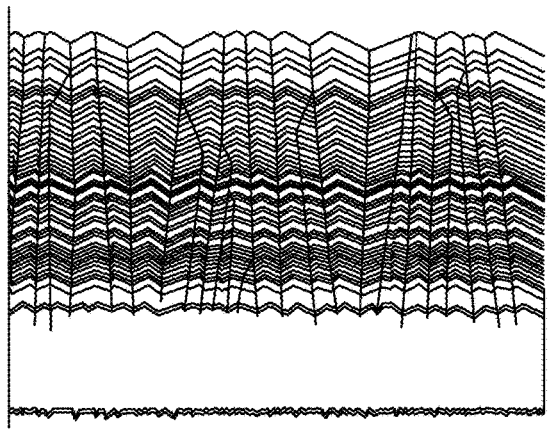
FIG. 13A shows simulation of ES growth, vertical lines denoting grain boundaries, horizontal lines denoting growth fronts at different times.
Figure 13B:
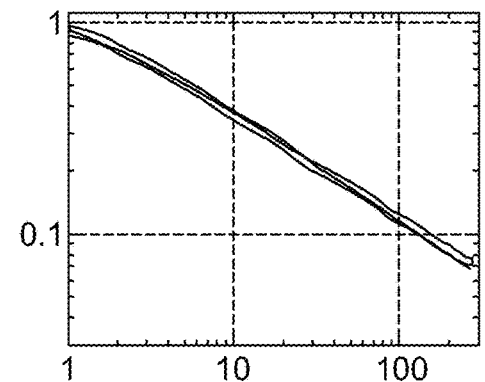
FIG. 13B shows the number of surviving grains as a percentage of original as film thickness increases.
Figure 13C:
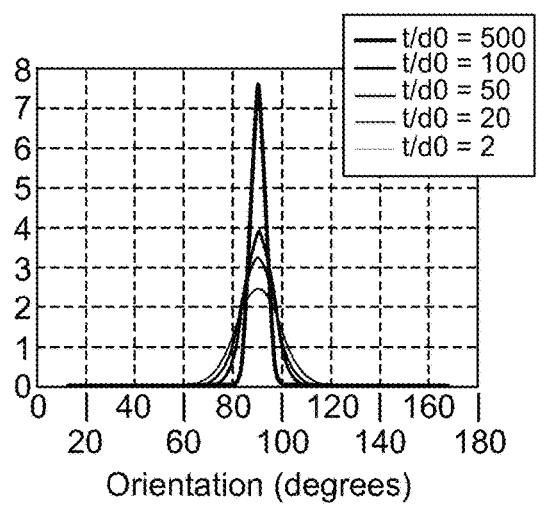
FIG. 13C shows the orientation distribution of grains at several film thicknesses, the sharpening of the peak around 90° shows the orientation selection of grains most closely oriented normal to the substrate.
Figure 13D:
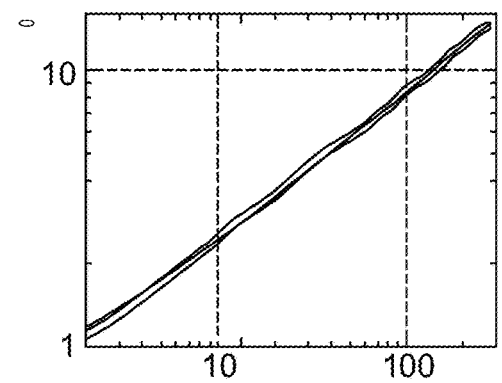
FIG. 13D shows average grain size as a function of thickness, display a $(h/d_0)$ ½ dependence.

The concepts explored here are expected to provide universal and flexible integration of semiconductor materials with a new range of substrates, including oxides, metals, ceramics and glass. The evolutionary growth dynamics have been analyzed both analytically and by computer simulation, mainly with regards to crystalline diamond growth[23]. Here, for GaN nuclei bounded by {1011} facets and hexagonal symmetry, the growth from a random distribution of nuclei with average spacing $d_0$, with a film thickness of h was modeled in Matlab. Each nuclei and grain boundary are set as points which extend upwards at a direction determined by the nuclei growth orientation or by the neighboring points. In FIG. 13, 2000 such points are used (only a portion is shown, for clarity). For each set of neighboring points, the time for intersection is precalculated, and the growth evolves to the next intersection. The grain or grain boundary is annihilated based on the geometry, and the direction is recalculated. With this simulation, the inverse-quadratic dependence of grain size over the distance of evolutionary selection $d/d_3{}^{oc} (h/d_0)^{1/2}$, where d is the average grain size, $d_0$ is the average initial nuclei spacing and h is the film thickness, is recovered. This relation implies that the geometric filtering tends to be slow beyond the initial growth, thus competing grains could co-exist over a long distance[23]. Also shown is the increasing sharpness with thickness of the orientation distribution function around the direction normal to the substration. In FIG. 13B, the x-axis is thickness ($h/d_0$) and the y-axis is number of grains ($N/N_0$). In FIG. 13C, the x-axis is orientation (degrees) and the y-axis is P(theta). In FIG. 13D, the x-axis is thickness ($h/d_0$) and the y-axis is average grain size ($d/d_0$). This simulation program, in FIG. 10(b) is used analyze the growth evolution of laterally unconfined growth from a wide AlN seed.

The crystalline material generated by the methods herein, particularly single crystal gallium nitride, can be used in a wide variety of applications, including but not limited to optical devices and high-temperature and high-power devices, such as light-emitting devices. The GaN layer can be an un-doped layer or may be doped to form a n-type GaN layer or a p-type GaN layer.

EXAMPLES

The following methods were used to generate and evaluate the single crystal GaN and other materials described and shown above and in the figures.

MOCVD growth of GaN on $SiO_2$: A low temperature (LT) GaN nucleation step (550° C.) was employed to deposit equivalent planar thickness 30 nm of material on $SiO_2$ on Si(001). The temperature was ramped to typical GaN growth temperature of 1030° C. for 15 minutes (at a planar growth rate of 2 μm/hr). Without the LT GaN step, the surface is completely clear of GaN crystallites, as desorption of Ga precursors on the mask occurs before critical nuclei size is reached under the growth conditions used. The nuclei formed during the low temperature deposition are enlarged with further growth at high temperature, with no coalescence of crystals as the nucleation density is too low due to the inert nature of $SiO_2$ and the high nucleation barrier.

Fabrication of $SiO_2$ tunnels on patterned AlN: A 650 nm thick AlN film was deposited on a thermally oxidized (500 nm thick $SiO_2$) 4" silicon wafers with (100) orientation by alternating current reactive magnetron sputtering (OEM Group Inc). This film has an (0001) texture, with an XRD rocking curve (0002) FWHM of 1.72°. The grain size is less than 100 nm with random in-plane orientation. The AlN is patterned, by standard photolithography and reactive-ion etching using $SiO_2$ as a mask into stripes with various widths (from 1 μm to 32 μm) and shapes. Alternatively, other suitable patterning and etching techniques can be used. 1 μm $SiO_2$ was then deposited by plasma enhanced chemical vapor deposition to cover the AlN patterns. A second photolithography was performed to open the ends of the tunnel by removing the $SiO_2$ on the sides of the AlN patterns using 5:1 buffered oxide etch. AlN is then undercut etch into the tunnel using 25% tetramethylammoniumhydroxide (TMAH) at 65° C. The lateral etch rates are between 0.5-1.5 μm/hr, with etch selectivity over $SiO_2$>50:1. Alternate etch rates are 0.1-7.5 μm/hr. The substrates are then cleaned in piranha (5 min) and HCl diluted with DI water 1:1 (5 min) and rinsed in DI water.

Selective area MOCVD growth of GaN in tunnel substrates: After substrates are dried, they are loaded into a metal-organic chemical vapor deposition (MOCVD) reactor (Aixtron 200-4 RF/S) for GaN growth. Trimethylgallium (TMGa) and ammonia ($NH_3$) are used as source precursors, and H2 as a carrier gas. The substrates are ramped up to a growth temperature of 1030° C. in mixture of $H_2$ (6.5 slm) and $NH_3$ (3 slm), and held for 4 minutes for thermal cleaning and nitridization of surfaces in preparation for selective area growth. The growth temperature may be between 900° C.-1160° C. TMGa is introduced into the chamber at growth conditions between 900° C.-1070° C., 60-300 mbar, and 0.5-2 slm $NH_3$. Typical longitudinal growth rates of GaN inside the tunnel are in the range of 4 to 12 μm/hr.

Characterization: To characterize growth, Nomarski optical microscopy was used to see GaN growth lengths within the tunnel. Scanning electron microscope was used to image the GaN crystals after removing the top $SiO_2$ confined mask by BOE. The crystal structure and orientation was analyzed by electron backscatter diffraction (EBSD) using a FEI Quanta 3D field emission SEM equipped with a TSL Hikari high speed EBSD camera. Measurements were performed at an electron accelerating voltage of 20 kV, and data was processed using OIM Data Analysis software and Matlab using the MTEX toolbox for inverse pole figure mapping and pole figure plots. Transmission electron microscopy samples were prepared by conventional mechanical polishing followed by ion milling down to electron transparency. Plan-view bright field image of GaN stripe is taken in [0001] zone-axis orientation.

The mechanism of evolutionary selection employed in this work is classified within the broader phenomena occurring during the spontaneous development of thin-film morphology, which have been classically organized within structure zone models (SZM)[5,6]. Substrate temperature was identified as of particular importance as it primarily influences the growth mechanisms including adsorption, surface diffusion, grain growth, bulk diffusion, and desorption[5,6,14]. This classification is based on the distinct microstructural morphologies observed, and is generally classified into three zones. In zone I, the film structure is characterized by either a porous or amorphous microstructure, due to ballistic aggregation, usually when T<0.3TM (TM is the melting point), as a result of insufficient adatom mobility[6]. In zone II, the film consists of non-equiaxed columnar grains, often exhibiting a preferred orientation. It is in this zone, that sufficient surface diffusion is present such that the anisotropy of facet growth rates and direction of growth with respect to the substrate determine the grain growth rate, resulting in an evolutionary selection process between graine. Above zone II temperatures, the film becomes dominated by equiaxial grains, often related to grain growth processes due to suitably high temperatures for grain boundary migration[7]. Since the majority of vapor phase epitaxy takes place at 0.4-0.5 $T_m$, surface diffusion of adatoms is sufficient for migration across islands and facets, and temperatures are not sufficient to activate grain growth in these materials[8,14], which allow ES growth to take place under conventional VPE.

With respect to the compositions described in the specification, it is intended that the specification also provides a description of methods of using any of those compositions in the described methods. With respect to the methods of manufacture described in the specification, it is intended that the specification also provides a description of the manufacture of any of the compositions described herein.

All of the references cited herein, including patents, patent applications, and publications, are hereby incorporated in their entireties by reference.

While particular elements, embodiments and applications of the present invention have been shown and described, it will be understood, of course, that the invention is not limited thereto since modifications can be made by those skilled in the art without departing from the scope of the present disclosure, particularly in light of the foregoing teachings.

Although the dependent claims have single dependencies in accordance with U.S. patent practice, each of the features in any of the dependent claims can be combined with each of the features of other dependent claims or the main claim.

REFERENCE

1. Givargizov, E. I. Mechansims of oriented crystallization in artificial epitaxy (graphoepitaxy), Thin Solid Films, 189, 389-396 (1990)
2. Geis, M. W., Flanders, D. C. & Smith, H. I. Crystallographic orientation of silicon on an amorphous substrate using an artificial surface-relief grating and laser crystallization, Appl. Phys. Lett. 35, 71-74 (1979)
3. Giermann, A. L. & Thompson, C. V. Solid-state dewetting for ordered arrays of crystallographically oriented metal particles, Appl. Phys. Lett. 86, 121903 (2005)
4. Evans, D. M. & Wilman, H. Crystal growth and orientation in deposits condensed from the vapour, Acta Cryst. 5, 731-738 (1952)
5. Thompson, C. V. Structure evolution during processing of polycrystalline films, Annu. Rev. Mater. Sci., 30, 159-90 (2000)
6. Thornton, J. A., High rate thick film growth, Ann. Rev. Mater. Sci. 7, 239-260 (1977).
7. Thompson, C. V. & Carel, R., Stress and grain growth in thin films, J. Mech. Phys. Solids, 44, 657 (1996)
8. van der Drift, A. Evolutionary selection, a principle governing growth orientation in vapour-deposited layers, Philips Res. Repts., 22, 267 (1967)
9. Schubert, E. F & Kim, J. K. Solid-state light sources getting smart, Science, 308, 1274-1278 (2005)
10. Pearton, S. J., Ren, F., Zhang, A. P., Lee, K. P. Fabrication and performance of GaN electronic devices, Mat Sci Eng R-Reports, 30, 55-212 (2000)

11. Watanabe, W., Takeuchi, T., Hirosawa, K., Amano, H., Hiramatsu, K. & Akasaki, I. The growth of single crystalline GaN on a Si substrate using AlN as an intermediate layer, *J. Cryst. Growth,* 128, 391-396 (1993)
12. Ishikawa, H. et al. Thermal stability of GaN on (111) Si substrate, *J. Cryst. Growth,* 189, 178-182 (1998)
13. Srivastava, P. et al. Silicon substrate removal of GaN DHFETs for enhanced (>1100 V) breakdown voltage, *Electron Devic. Lett.,* 31, 851 (2010)
14. Kajikawa, Y., Noda, S. & Komiyama, H. Comprehensive perspective on the mechanism of preferred orientation in reactive-sputter-deposited nitrides, *J. Vac. Sci. Technol. A,* 21, 1943 (2003)
15. Sundgren, J. E. Structure and properties of TiN coatings, Thin Solid Films 128, 21 (1985).
16. Abadias, G., Stress and preferred orientation in nitride-based PVD coatings, *Surface & Coatings Technology,* 202, 2223-2235 (2008)
17. Ohuchi, F. S. & Russell, P. E. AlN thin films with controlled crystallographic orientations and their microstructure, *J. Vac. Sci. Technol. A,* 5, 1630 (1987)
18. Choi, J. H. et al., Nearly single-crystalline GaN light-emitting diodes on amorphous glass substrates, *Nature Photonics,* 5, 763 (2011)
19. Sun, Q., Yerino, C. D., Leung, B., Han, J. & Coltrin, M. E. Understanding and controlling heteroepitaxy with the kinetic Wulff plot: A case study with GaN, *J. Appl. Phys.,* 110, 053517 (2011)
20. Pribat, D., Karapiperis, L. & Collet, C. Conformal vapor phase epitaxy, *Appl. Phys. Lett.,* 55, 2544 (1989)
21. McComber, K. A., Duan, X., Liu, J., Michel, J. & Kimerling, L. C. Single-crystal germanium growth on amorphous silicon, Adv. Funct. Mater., 22, 1049 (2012)
22. Van Swygenhoven, Helena Grain boundaries and dislocations, *Science,* 296, 66 (2002)
23. Paritosh, Srolovitz, D. J., Battaile, C. C., Li, X. & Butler, J. E. Simulation of faceted film growth in two-dimensions: microstructure, morphology and texture, *Acta mater.,* 47, 2269-2281 (1999)

The invention is claimed as follows:

1. A method for generating a crystalline material, the method comprising:
   depositing a textured thin film of a nitride material in a growth seed area, wherein the textured thin film comprises fibrous grains having a majority oriented along a preferred crystallographic axis;
   providing a growth channel extending from the growth seed area, the growth channel permitting guided lateral growth; and
   growing a III-V crystalline material at a temperature of at least 900° C. in the growth channel along a direction that is perpendicular to the preferred crystallographic axis of the textured thin film, wherein the textured thin film has not undergone recrystallization up until the crystalline material begins to grow, wherein the crystalline material is gallium nitride.

2. The method of claim 1, further comprising:
   growing the crystalline material into a single crystalline region at an end of the growth channel wherein the crystalline material is single crystalline over an area as large as 200 square microns.

3. The method of claim 1 wherein the textured thin film comprises aluminum nitride or titanium nitride.

4. The method of claim 1, wherein the crystalline material is grown on an amorphous substrate such that the crystalline material and the substrate are heterogeneously integrated.

5. The method of claim 4, wherein the substrate comprises silicon dioxide.

6. The method of claim 1, further comprising the step of generating the crystalline material from a polycrystalline material by evolutionary selection within the growth channel, wherein the polycrystalline material is grown from the growth seed area.

7. The method of claim 1, wherein the method comprises selectively growing a polycrystalline material from the growth seed area and continuing through the growth channel such that the multiplicity of orientations in the polycrystalline material lessen as the growth extends farther from the growth seed area in the growth channel, thereby providing the crystalline material having a single orientation from the polycrystalline material.

8. The method of claim 1, wherein the growing of the crystalline material from the seed area into the growth channel is selected from metalorganic chemical vapor deposition, hydride vapor phase epitaxy, molecular beam epitaxy or liquid phase epitaxy.

9. The method of claim 1, wherein depositing the textured thin film comprises depositing the textured thin film such that a portion of the thin film is connected to the growth channel to provide a growth seed area.

10. The method of claim 9, wherein the portion of the thin film that provides the growth seed area is a side surface or a top of the textured thin film.

11. The method of claim 10, wherein the growth channel is formed by:
   patterning the textured thin film into one or more desired thin film patterns,
   covering said one or more thin film patterns with dielectric material to form a dielectric cover, wherein the dielectric cover has at least a first end and a second end;
   removing at least a portion of the first end of the dielectric cover so as to expose an edge of the thin film pattern, and
   removing a first portion of the textured thin film from under the dielectric cover to form a tunnel while leaving a second portion of the textured thin film within the second end of the dielectric cover, wherein the second portion of the textured thin film has a side surface;
   wherein the side surface of the thin film serves as the growth seed area.

12. The method of claim 10, wherein the portion of the thin film that provides the growth seed area is a top surface of the textured thin film, and wherein the growth channel is formed by:
   covering the textured thin film with a first dielectric layer having a top surface,
   opening a window to form the growth seed area,
   covering the top surface of the first dielectric layer and the growth seed area with a sacrificial layer,
   patterning the sacrificial layer into desirable shapes with one portion connected to the growth seed area,
   depositing a second dielectric layer on top of the sacrificial layer,
   performing another patterning to expose the edge of the sacrificial layer, and
   removing the sacrificial layer to form a channel defined by the first and second dielectric layers connected to the growth seed area.

13. A method for generating a crystalline material on a substrate, the method comprising:
   depositing a textured thin film of a nitride material in a growth seed area of a substrate, wherein the growth seed area has a first width and the textured thin film comprises fibrous grains having a majority oriented along a preferred crystallographic axis;

providing a growth channel on the substrate connected to the growth seed area, the growth channel having a second width, wherein the second width is less than the first width;

providing a growth area on the substrate connected to the growth channel, the growth area having a third width, wherein the third width is greater than the second width; and selectively growing gallium nitride crystalline material at a temperature of at least 900° C. from the growth seed area and continuing through the growth channel such that a multiplicity of orientations in the gallium nitride crystalline material lessen as the growth of the gallium nitride crystalline material extends farther from the growth seed area, wherein the gallium nitride crystalline material in the growth area has a single orientation and wherein the textured thin film has not undergone recrystallization up until selectively growing the gallium nitride crystalline material.

14. The method of claim 13, further comprising forming the growth channel by depositing a grooved dielectric layer on the textured thin film or a substrate.

15. The method of claim 13, further comprising depositing a vertical confinement layer above the growth channel and optionally above the growth area such that the growth of the crystalline gallium nitride material is vertically confined at least through the growth channel and optionally in the growth area.

16. The method of claim 13, wherein the crystalline material in the growth area is single crystal over an area as large as 200 square microns.

17. The method of claim 16, wherein:
the textured thin film comprises aluminum nitride or titanium nitride; and
the substrate comprises silicon or silicon dioxide.

18. A method for producing a gallium nitride crystalline material, the method comprising:
depositing a textured thin film of a nitride material in a growth seed area, wherein the textured thin film comprises fibrous grains having a majority oriented along a preferred crystallographic axis;

providing a growth channel extending from the growth seed area, the growth channel permitting guided lateral growth; and growing the gallium nitride crystalline material at a temperature of at least 900° C. in the growth channel along a direction that is perpendicular to the preferred crystallographic axis of the textured thin film, wherein the textured thin film has not undergone recrystallization up until the crystalline material begins to grow.

19. The method of claim 18, wherein the textured thin film comprises aluminum nitride, zirconium nitride, or titanium nitride.

20. The method of claim 18, further comprising depositing the textured thin film on an amorphous substrate.

21. The method of claim 18, wherein the method comprises selectively growing a polycrystalline material from the growth seed area and continuing through the growth channel such that the multiplicity of orientations in the polycrystalline material lessen as the growth extends farther from the growth seed area in the growth channel, thereby providing gallium nitride crystalline material having a single orientation over an area as large as 200 square microns.

* * * * *